(12) United States Patent
Ohnuma

(10) Patent No.: US 8,233,203 B2
(45) Date of Patent: Jul. 31, 2012

(54) EXPOSURE METHOD AND METHOD OF MANUFACTURING SEMICONDUCTOR DEVICE

(75) Inventor: Hideto Ohnuma, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 617 days.

(21) Appl. No.: 11/705,049

(22) Filed: Feb. 12, 2007

(65) Prior Publication Data

US 2007/0206253 A1    Sep. 6, 2007

(30) Foreign Application Priority Data

Feb. 15, 2006   (JP) ................................. 2006-038027

(51) Int. Cl.
- *G03H 1/20* (2006.01)
- *G03H 1/22* (2006.01)
- *G02B 5/32* (2006.01)
- *G02B 27/54* (2006.01)

(52) U.S. Cl. ................. 359/12; 359/15; 359/32; 355/67

(58) Field of Classification Search ...................... 359/32
See application file for complete search history.

(56) References Cited

U.S. PATENT DOCUMENTS

| | | | |
|---|---|---|---|
| 3,542,452 A | 11/1970 | Gerritsen et al. | |
| 3,677,634 A | 7/1972 | Mathisen | |
| 4,244,633 A | 1/1981 | Kellie | |
| 4,857,425 A | 8/1989 | Phillips | |
| 5,113,402 A | 5/1992 | Itani et al. | |
| 5,774,240 A | 6/1998 | Goto et al. | |
| 6,005,666 A | 12/1999 | Dändliker et al. | |
| 6,842,465 B2* | 1/2005 | Lee | ................................. 372/22 |
| 7,027,197 B2* | 4/2006 | Newswanger et al. | ......... 359/35 |
| 7,092,134 B1 | 8/2006 | Han et al. | |
| 8,053,145 B2* | 11/2011 | Ohnuma | ........................... 430/1 |
| 2003/0039896 A1 | 2/2003 | Iriguchi | |

(Continued)

FOREIGN PATENT DOCUMENTS

EP    0 418 890 A2    3/1991

(Continued)

OTHER PUBLICATIONS

Hariharan, P., Optical Holography, Principles, techniques and applications, 1996, Cambridge University Press, Second Edition, 69-71.*

Primary Examiner — Jade R Chwasz
(74) Attorney, Agent, or Firm — Nixon Peabody LLP; Jeffrey L. Costellia

(57) ABSTRACT

The exposure method includes the steps of: illuminating a hologram recording medium, in which a hologram with a first pattern has been recorded by illumination with a laser beam emitted from a first laser oscillator, with a laser beam emitted from a second laser oscillator; and delivering the laser beam emitted from the second laser oscillator, which has passed through the hologram recording medium, onto a resist, thereby forming a second pattern in the resist. The wavelength of the laser beam used for illuminating the resist through the hologram recording medium in which the hologram is recorded is shorter than the wavelength of the laser beam used for recording the hologram in the hologram recording medium. Further, the wavelength of the laser beam used for illuminating the resist is $1/(0.5 \times n)$ (where n is an integer not less than 3) that of the laser beam used for recording the hologram.

31 Claims, 14 Drawing Sheets

U.S. PATENT DOCUMENTS

| | | |
|---|---|---|
| 2004/0169837 A1 | 9/2004 | Pril et al. |
| 2005/0002311 A1 | 1/2005 | Ichihara et al. |
| 2006/0121357 A1 | 6/2006 | Clube |
| 2006/0232838 A1 | 10/2006 | Clube |
| 2007/0092804 A1 | 4/2007 | Kolb et al. |
| 2008/0176145 A1 | 7/2008 | Ohnuma |

FOREIGN PATENT DOCUMENTS

| | | |
|---|---|---|
| JP | 03-183117 | 8/1991 |
| JP | 2922958 | 7/1999 |
| JP | 2004-086193 | 3/2004 |
| JP | 2004-253660 | 9/2004 |

* cited by examiner

EXPOSURE METHOD AND METHOD OF MANUFACTURING SEMICONDUCTOR DEVICE

BACKGROUND OF THE INVENTION

1. Field of the Invention

The present invention relates to an exposure method and a method of manufacturing a semiconductor device using the exposure method. In particular, the present invention relates to an exposure method using holography.

2. Description of the Related Art

In recent years, an exposure technique using holography has drawn attention as a pattern formation method in the process of manufacturing a semiconductor device. The exposure technique using holography includes a step of recording a hologram in a medium for the recording of a hologram (hereinafter referred to as a "hologram recording medium") by illuminating the hologram recording medium with an object beam and a reference beam (a recording step), and a step of reconstructing a holographic image on an illumination target such as a resist by illuminating the hologram recording medium with a reconstruction beam (a reconstruction step).

In the recording step, the hologram recording medium is illuminated with a first laser beam (an object beam) through a mask having a desired pattern, and at the same time, the hologram recording medium is illuminated with a second laser beam (a reference beam) from a direction different from the first laser beam. Thus, by illuminating the hologram recording medium with the first laser beam and the second laser beam at the same time, a fringe pattern that is produced by optical interference between the first laser beam and the second laser beam is formed in the hologram recording medium. In the reconstruction step, the hologram recording medium is illuminated with a laser beam as a reconstruction beam, so that diffraction rays that reproduce the original pattern are projected onto a resist which is formed over a substrate.

Research has been conducted on a micropattern formation method or the like. For example, in the recording step and the reconstruction step of the exposure technique using holography, a resist is formed into a pattern with a smaller feature size than the original pattern by using laser beams which are emitted from different kinds of laser oscillators (for example, see Reference 1: Japanese Published Patent Application No. 2004-253660).

SUMMARY OF THE INVENTION

However, although various research has been conducted on reduction-projection exposure using holography, there has not been enough research on forming a device by combining holographic reduction-projection exposure with actual mask design for miniaturization of the device or with another exposure process.

For example, consider the case of forming a resist pattern with a width of 0.5 μm. When the third harmonic (wavelength: 355 nm) of an Nd:YAG laser is used as the recording light source and an $F_2$ laser (wavelength: 157 nm) is used as the reconstruction light source, the magnification ratio of the wavelength of the recording beam to the wavelength of the reconstruction beam is 2.26:1. In this case, it is necessary to form the original mask pattern to have a width of 1.13 μm (0.5 μm×2.26), and thus the smallest unit of the pattern width becomes as small as 0.01 μm, which results in problems of a large volume of original mask data, long design time, and long data reading time. Furthermore, since high processing accuracy is required for the pattern formed in the original mask, the cost might increase undesirably.

Meanwhile, if the processing accuracy of the pattern formed in the original mask is insufficient, an alignment process or the like in manufacturing a device might not be conducted accurately. This problem becomes more serious as the device is more miniaturized or in the case of manufacturing the device by combining the holographic reduction-projection exposure with another exposure system such as a stepper or a MPA (Mirror Projection Aligner).

In view of the foregoing, the present invention provides an exposure method which can eliminate problems in alignment or the like and complexity in the design of the original mask or the like even in the case of reducing the pattern size of the original mask pattern when projecting the original mask pattern onto a resist, and also provides a method of manufacturing a semiconductor device using the exposure method.

An exposure method of the present invention includes the steps of: illuminating a hologram recording medium, in which a hologram with a first pattern has been recorded by illumination with a laser beam emitted from a first laser oscillator, with a laser beam emitted from a second laser oscillator; and delivering the laser beam emitted from the second laser oscillator, which has passed through the hologram recording medium, onto a resist, thereby forming a second pattern in the resist. The wavelength of the laser beam used for illuminating the resist through the hologram recording medium in which the hologram is recorded is shorter than the wavelength of the laser beam used for recording the hologram in the hologram recording medium. Also, the wavelength of the laser beam used for illuminating the resist is 1/(0.5×n) (where n is an integer not less than 3) that of the laser beam used for recording the hologram. That is, given that the wavelength of the laser beam which is emitted from the first laser oscillator and delivered to the hologram recording medium is $\lambda_1$ and the wavelength of the laser beam which is emitted from the second laser oscillator and delivered to the hologram recording medium is $\lambda_2$, illumination of the hologram recording medium with the laser beam emitted from the second laser oscillator is conducted so as to satisfy $\lambda_1 > \lambda_2$ and $\lambda_2 = \lambda_1/(0.5 \times n)$ (where n is an integer not less than 3).

The method of recording the hologram having the first pattern into the hologram recording medium can be conducted through the steps of splitting a laser beam emitted from a first laser oscillator into a first laser beam and a second laser beam, and illuminating the hologram recording medium with either the first laser beam or the second laser beam (e.g., with the first laser beam) through a mask having a first pattern while at the same time illuminating the hologram recording medium with the other laser beam (e.g., with the second laser beam). In the hologram recording medium, a fringe pattern that is produced by optical interference between the first laser beam and the second laser beam is formed. Subsequently, by illuminating the hologram recording medium having the fringe pattern with a third laser beam which is emitted from a second laser oscillator, and delivering the third laser beam, which has passed through the hologram recording medium, onto a resist, a second pattern can be formed in the resist.

In the above method, the wavelength of the third laser beam is shorter than the wavelengths of the first laser beam and the second laser beam. Also, the wavelengths of the first laser beam and the second laser beam are (0.5×n) (where n is an integer not less than 3) times that of the third laser beam. As the first laser oscillator and the second laser oscillator, different kinds of laser oscillators, the same kind of laser oscillators, or the same oscillator can be used. Note that in this specification, "to use the same kind of laser oscillators"

means "to use different laser oscillators which emit laser beams with the same wavelength (e.g., a combination of a YAG laser and a YAG laser or a combination of a $YVO_4$ laser and a $YVO_4$ laser)", and "to use the same laser oscillator" means "to use the very same laser oscillator".

In the exposure method of the invention, a solid-state laser oscillator is used as the laser oscillator. In particular, the solid-state laser oscillator can be a YAG laser oscillator, a $YVO_4$ laser oscillator, a YLF laser oscillator, a $YAlO_3$ laser oscillator, a $GdVO_4$ laser oscillator, or the like.

A method of manufacturing a semiconductor device of the present invention includes the steps of: forming a semiconductor film over a substrate; forming a conductive film over the semiconductor film; forming a resist over the conductive film; illuminating a hologram recording medium, in which a hologram with a first pattern has been recorded by illumination with a laser beam emitted from a first laser oscillator, with a laser beam emitted from a second laser oscillator; and delivering the laser beam emitted from the second laser oscillator, which has passed through the hologram recording medium, onto a resist, thereby forming a second pattern in the resist. The wavelength of the laser beam used for illuminating the resist through the hologram recording medium in which the hologram is recorded is shorter than the wavelength of the laser beam used for recording the hologram in the hologram recording medium. Also, the wavelength of the laser beam used for illuminating the resist is $1/(0.5 \times n)$ (where n is an integer not less than 3) that of the laser beam used for recording the hologram.

A method of manufacturing a semiconductor device of the present invention includes the steps of: forming a semiconductor film over a substrate; forming a conductive film over the semiconductor film; forming a resist over the conductive film; illuminating a hologram recording medium, in which a hologram with a first pattern has been recorded by illumination with a laser beam emitted from a first laser oscillator, with a laser beam emitted from a second laser oscillator; and delivering the laser beam emitted from the second laser oscillator, which has passed through the hologram recording medium, onto a resist, thereby forming a second pattern in the resist. The same kind of laser oscillators are used for the first laser oscillator and the second laser oscillator. The wavelength of the laser beam used for illuminating the resist through the hologram recording medium in which the hologram is recorded is shorter than the wavelength of the laser beam used for recording the hologram in the hologram recording medium. Also, a harmonic is used as the laser beam for illuminating the resist.

By using the exposure method of the invention, problems in alignment or the like and complexity in the design of the original mask or the like can be eliminated even in the case of reducing the pattern size of the original mask pattern when projecting the original mask pattern onto a resist. Further, when forming a device such as a semiconductor device by using the exposure method of the invention, an alignment process can be conducted accurately even in combination with another exposure method in the manufacturing process.

DETAILED DESCRIPTION OF THE INVENTION

Figure 1:
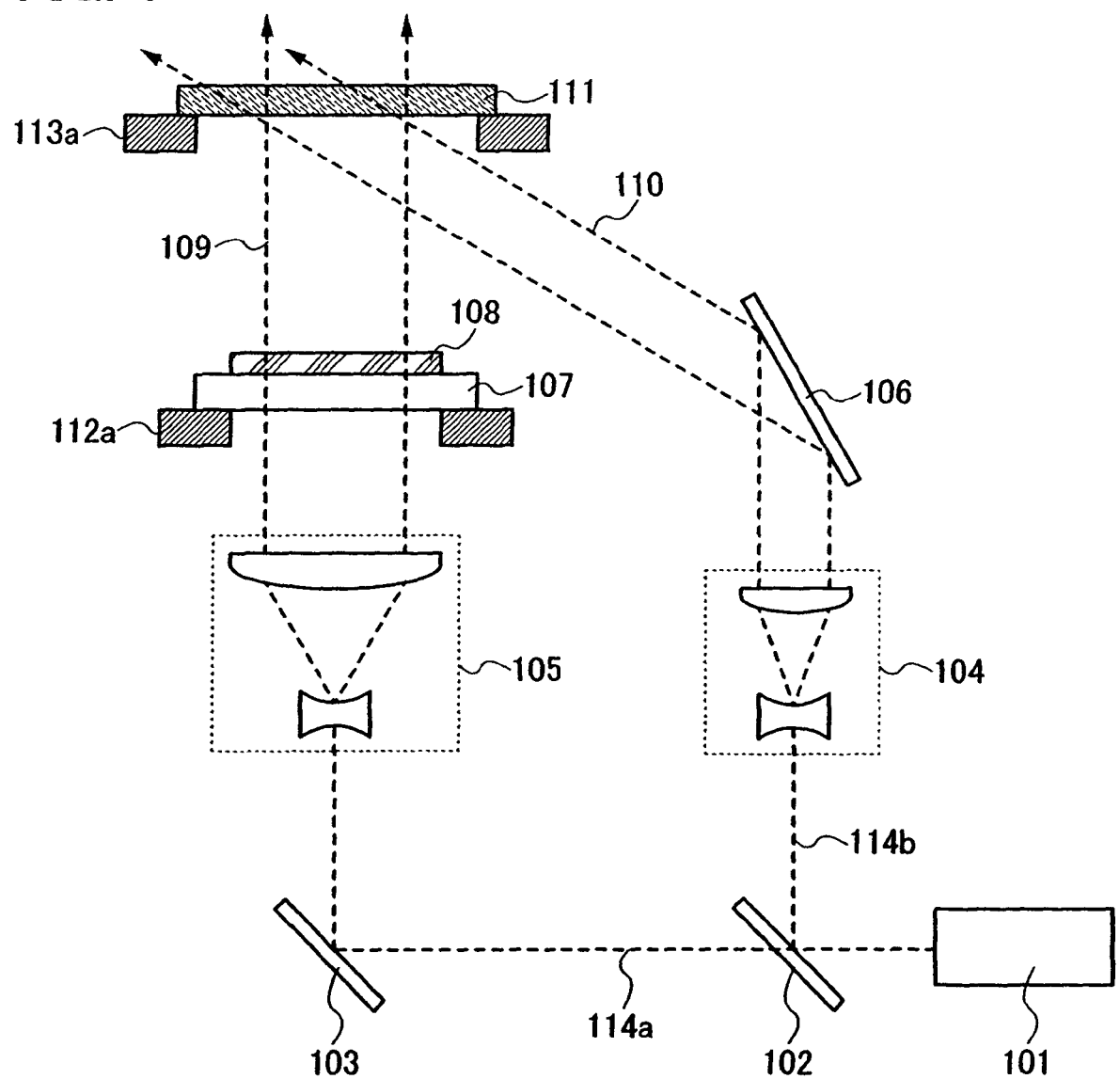
FIG. 1 shows an example of an exposure method of the invention.

Embodiment modes of the present invention will be described in detail below with reference to the accompanying drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiment modes. In the structure of the present invention described below, like reference numerals may be used to designate portions which are identical in different drawings.

Embodiment Mode 1

In this embodiment mode, an example of an exposure method of the present invention using holography is described with reference to the drawings. Specifically, a step of recording the original mask pattern in a hologram recording medium and a step of reconstructing the hologram recorded in the hologram recording medium by projecting the holographic image onto a resist which is formed over a substrate are described, with reference to FIG. 1 and FIG. 2, respectively First, an example of an exposure system used in this embodiment mode is shown in FIG. 1.

The exposure system shown in FIG. 1 includes a laser oscillator 101, a beam splitter 102 for splitting a laser beam emitted from the laser oscillator 101, mirrors 103 and 106 for reflecting laser beams in desired directions, magnification optics 104 and 105 for magnifying the size of laser beams, and stages 112a and 113a.

The stages 112a and 113a are provided for positioning samples used in the exposure process, and the position of the stages 112a and 113a is adjustable in the vertical and horizontal directions. Here, an example is shown in which an original mask 108 is positioned on the stage 112a as a sample, and a hologram recording medium 111 is positioned on the stage 113a as a sample.

Next, the step of recording the pattern of the original mask 108 in the hologram recording medium 111 (the recording step), using the exposure system shown in FIG. 1 is described.

A laser beam emitted from the laser oscillator 101 is split into laser beams at an appropriate intensity ratio by the beam splitter 102. Here, the laser beam is split into a first laser beam 114a and a second laser beam 114b. The first laser beam 114a is magnified by the magnification optics 105, and then travels through the original mask 108 formed over a substrate 107, and finally enters the hologram recording medium 111 as an object beam 109. Meanwhile, the second laser beam 114b is magnified by the magnification optics 104 and then enters the hologram recording medium 111 as a reference beam 110. In this manner, when the hologram recording medium 111 is illuminated with the object beam 109 and the reference beam 110 at the same time, a fringe pattern that is produced by optical interference between the object beam 109 and the reference beam 110 is formed in the hologram recording medium 111. That is, a hologram having the pattern of the original mask 108 is recorded in the hologram recording medium 111.

As the laser oscillator 101, a solid-state laser such as a YAG laser, a $YVO_4$ laser, a YLF laser, a $YAlO_3$ laser, or a $GdVO_4$ laser can be used. Specifically, a solid-state laser in which crystals such as YAG, $YVO_4$, YLF, $YAlO_3$, or $GdVO_4$ are doped with Cr, Nd, Er, Ho, Ce, Co, Ti, or Tm is used. Note that in the invention, the fundamental wave to the fifth harmonic of such solid-state laser oscillators are selectively used as appropriate. The harmonics relative to the fundamental wave can be obtained by using a nonlinear optical element.

Figure 2:
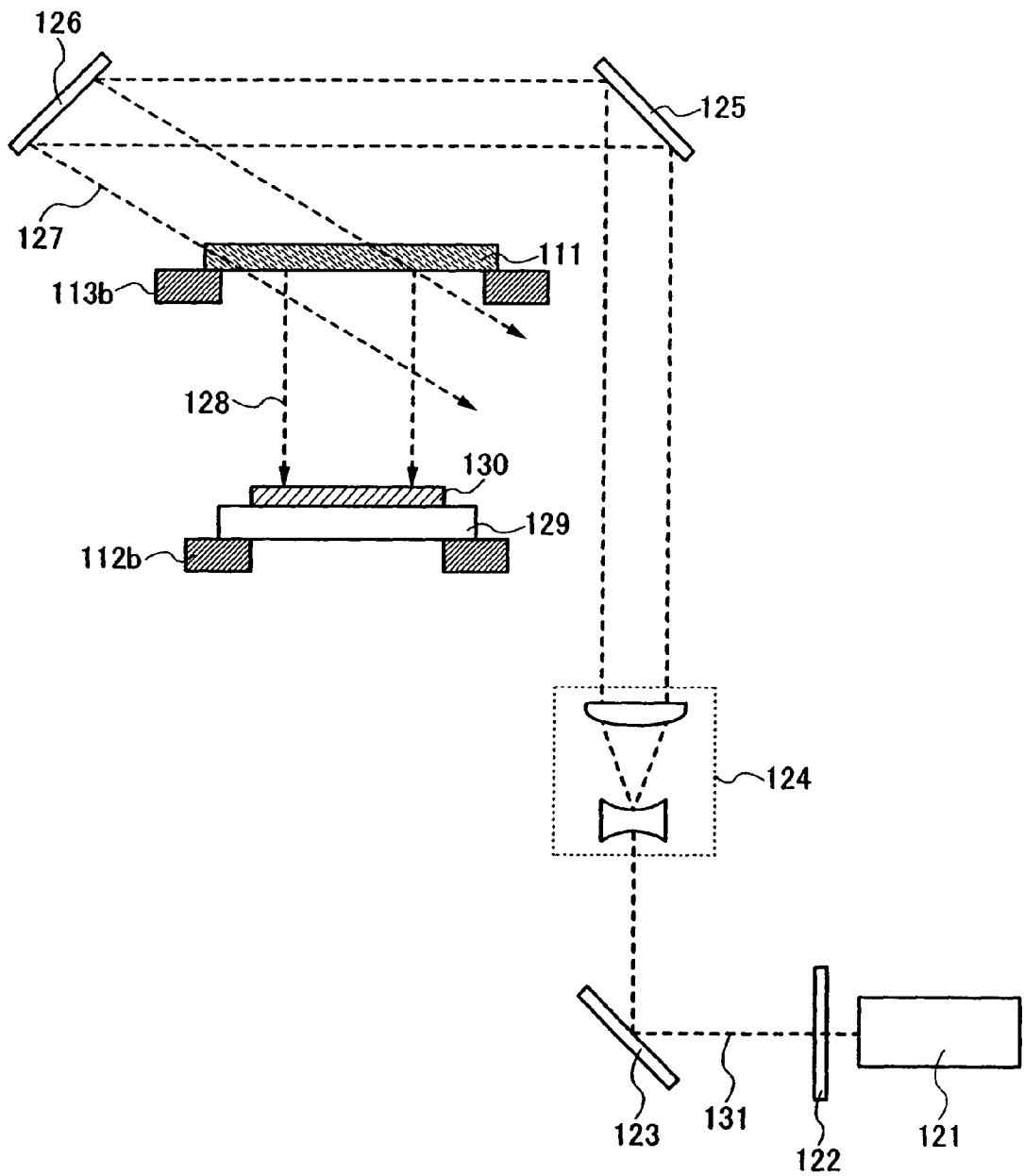
FIG. 2 shows an example of an exposure method of the invention.

Next, an exemplary step of reconstructing the hologram recorded in the hologram recording medium 111 which is formed in FIG. 1 by projecting the holographic image onto a resist (a reconstruction step) is shown in FIG. 2.

A laser beam emitted from a laser oscillator 121 is converted into a harmonic by a nonlinear optical element 122 to become a laser beam 131. The traveling direction of the laser beam 131 which has been converted into the harmonic is changed by a mirror 123. Then, the laser beam 131 is magnified by magnification optics 124. After that, the traveling direction of the laser beam 131 is changed by mirrors 125 and 126, and the laser beam 131 finally enters the hologram recording medium 111 as a reconstruction reference beam 127. The reconstruction reference beam 127 which has entered the hologram recording medium 111 is diffracted by the fringe pattern formed in the hologram recording medium 111, and a part of the diffraction rays enters, as a reconstruction beam 128, a resist 130 which is provided over a substrate 129. Note that here, the substrate 129 is disposed on a stage 112b and the hologram recording medium 111 having the fringe pattern is disposed on a stage 113b. In addition, the reconstruction reference beam 127 is controlled to enter the hologram recording medium 111 from a direction opposite to the reference beam 110 shown in FIG. 1, and the resist 130 is disposed in the place where the original mask 108 shown in FIG. 1 was disposed.

In the reconstruction step shown in FIG. 2, a laser beam having a shorter wavelength than the first laser beam 114a and the second laser beam 114b which are used in the recording step shown in FIG. 1 is used as the laser beam 131 which is used for projecting the hologram recorded in the hologram recording medium 111 onto the resist 130. Further, the wavelength of the laser beam used as the laser beam 131 is equal to 1/(0.5×n) (where n is an integer not less than 3) the wavelength of the first laser beam 114a and the second laser beam 114b. The wavelength of the laser beam 131 is not completely same as 1/(0.5×n) (where n is an integer not less than 3) the wavelengths of the first laser beam 114a and the second laser beam 114b, and the wavelength of the laser beam 131 may shift from 1/(0.5×n) (where n is an integer not less than 3) the wavelengths of the first laser beam 114a and the second laser beam 114b in the range that those skilled in the art can identify. Here, a harmonic of the first laser beam 114a and the second laser beam 114b which are used in the recording step can be used as the laser beam 131 which is used in the reconstruction step. That is, the same kind of laser oscillator as or the same laser oscillator as the laser oscillator 101 which is used in the recording step is employed as the laser oscillator 121 which is used in the reconstruction step, and a laser beam emitted from the laser oscillator 121 is converted into a harmonic with the nonlinear optical element 122, as shown in FIG. 2. In addition, the stage 112b and the stage 113b can be the same stages as the stage 112a and the stage 113a which are used in the recording step shown in FIG. 1.

Specifically, in the recording step shown in FIG. 1, a YAG laser is used as the laser oscillator 101, and the fundamental wave (wavelength: 1064 nm) of the YAG laser is used as the first laser beam 114a and the second laser beam 114b. Meanwhile, in the reconstruction step shown in FIG. 2, a YAG laser is used as the laser oscillator 121, and a laser beam which is emitted from the laser oscillator 121 and then converted into a harmonic with the nonlinear optical element 122 is used as the laser beam 131. As the laser beam 131, for example, the third harmonic (wavelength: 355 nm) of the YAG laser is used. In that case, the wavelengths of the first laser beam 114a and the second laser beam 114b which are used in the recording step are three times that of the laser beam 131 which is used in the reconstruction step. Thus, a pattern with a size ⅓ that of the pattern of the original mask 108 can be projected on the resist 130. Note that the laser oscillators are not limited to the YAG laser. As long as the same kind of laser oscillator is used for the laser oscillator 101 as for the laser oscillator 121, any of the above-described solid-state lasers can be used.

Alternatively, it is also possible to use the second harmonic (wavelength: 532 nm) of the YAG laser as the first laser beam 114a and the second laser beam 114b, and use the third harmonic (wavelength: 355 nm) of the YAG laser as the laser beam 131. In that case, the wavelengths of the first laser beam 114a and the second laser beam 114b which are used in the recording step are 1.5 times that of the laser beam 131 which is used in the reconstruction step. Thus, a pattern with a size ¹⁄₁.₅ that of the pattern of the original mask 108 can be projected on the resist 130. In the case of using harmonics for the first laser beam 114a and the second laser beam 114b, a laser beam emitted from the laser oscillator 101 may be converted into a harmonic by using a nonlinear optical element before it is split into the first laser beam 114a and the second laser beam 114b.

In this manner, by using a laser beam which has a shorter wavelength than the first laser beam 114a and the second laser beam 114b, and which is also a harmonic of the first laser beam 114a and the second laser beam 114b, as the third laser beam 131, a pattern with a size 1/(0.5×n) (where n is an integer not less than 3) that of the original mask 108 can be projected on the resist 130. When laser oscillators capable of emitting laser beams in the range of the fundamental wave to the fifth harmonic are used as the laser oscillators 101 and 121, the resist 130 can be formed into a pattern having a size ¹⁄₁.₅, ½, ¹⁄₂.₅, ⅓, ¼, or ⅕ that of the original mask 108, by combining the wavelengths of the laser beams emitted from the laser oscillator 101 and the laser oscillator 121.

For example, in order to form a 0.5 μm-width pattern in the resist 130, the pattern of the original mask 108 can be formed with a size of: 1 μm (in the case of using the fundamental wave for the recording step and using the second harmonic for the reconstruction step, or in the case of using the second harmonic for the recording step and using the fourth harmonic for the reconstruction step), 1.5 μm (in the case of using the fundamental wave for the recording step and using the third harmonic for the reconstruction step), 2 μm (in the case of using the fundamental wave for the recording step and using the fourth harmonic for the reconstruction step), or 2.5 μm (in the case of using the fundamental wave for the recording step and using the fifth harmonic for the reconstruction step), for example.

In addition, the exposure method using holography shown in this embodiment mode can be combined with optics which reduce the pattern size. In that case, the original mask pattern can be reduced even more in size and projected on the resist.

Although this embodiment mode shows the example of using a transmission hologram, a reflection hologram can also be used. In the case of using a reflection hologram, for example, the light incident directions of the reference beam 110 used in the recording step shown in FIG. 1 and the reconstruction reference beam 127 used in the reconstruction step shown in FIG. 2 may be reversed. Specifically, in the recording step, the reference beam 110 is controlled to enter the hologram recording medium 111 from a direction opposite to the incident direction of the object beam 109 (i.e., from the top-surface side of the hologram recording medium 111 in FIG. 1), while in the reconstruction step, the reconstruction reference beam 127 is controlled to enter from a direction opposite to the reference beam 110 (i.e., from the bottom-surface side of the hologram recording medium 111 in FIG. 2).

In this manner, in the exposure method using holography, by setting the wavelength of the laser beam used in the reconstruction step to be shorter than the wavelength of the laser beam used in the recording step, the original mask pattern can be reduced in size and projected on the resist. In addition, by using a harmonic having a shorter wavelength than the laser beam used in the recording step for the laser beam used in the reconstruction beam, a pattern with a size reduced to at least 1/(0.5×n) (where n is an integer not less than 3) that of the original mask pattern can be projected on the resist. As a result, the minimum unit of the dimensions of the pattern formed in the original mask or the resist can be reduced, which leads to a simplified layout design of the original mask. Furthermore, by reducing the minimum unit of the dimensions of the pattern formed in the resist, an alignment process and the like can be performed accurately when manufacturing a device by combining the holographic exposure method with another exposure method (e.g., a stepper or an MPA). The higher the number of manufacturing steps or the more a device is moisturized, the greater the advantageous effects of the invention.

Embodiment Mode 2

In this embodiment mode, an exposure method which is different from the above embodiment mode is described with reference to the drawings. Specifically, an exposure method using total internal reflection holography with a prism is described.

Figure 3:
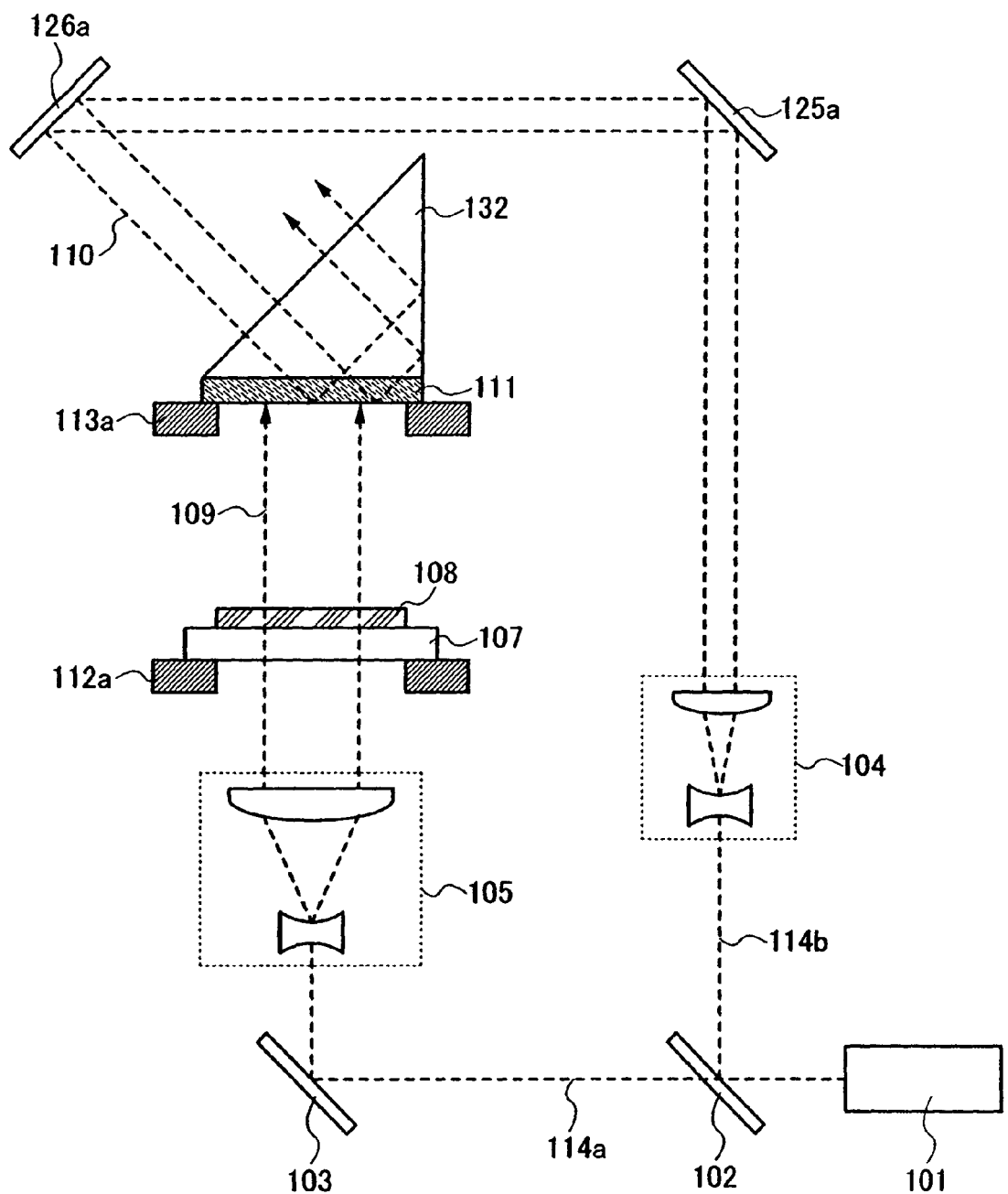
FIG. 3 shows an example of an exposure method of the invention.

First, an exposure system used in the step of recording the original mask pattern in a hologram recording medium (the recording step) is shown in FIG. 3.

The exposure system shown in FIG. 3 includes a laser oscillator 101, a beam splitter 102 for splitting a laser beam emitted from the laser oscillator 101, mirrors 103, 125a, and 126a for reflecting laser beams in desired directions, magnification optics 104 and 105 for magnifying the size of laser beams, and stages 112a and 113a.

The stages 112a and 113a are provided for positioning samples used in the exposure process, and the position of the stages 112a and 113a is adjustable in the vertical and horizontal directions. In the example shown herein, an original mask 108 provided over a substrate 107 is positioned on the stage 112a, and a hologram recording medium 111 fixed on a prism 132 is positioned on the stage 113a.

Next, the step of recording the pattern of the original mask 108 in the hologram recording medium 111 fixed on the prism 132 (the recording step), using the exposure system shown in FIG. 3 is described.

A laser beam emitted from the laser oscillator 101 is split into laser beams at an appropriate intensity ratio by the beam splitter 102. Here, the laser beam is split into a first laser beam 114a and a second laser beam 114b. Then, the first laser beam 114a is magnified by the magnification optics 105, and travels through the original mask 108 formed over the substrate 107, and finally enters the hologram recording medium 111 as an object beam 109. Meanwhile, the second laser beam 114b is magnified by the magnification optics 104, and then the traveling direction of the second laser beam 114b is changed by the mirrors 125a and 126a. Finally, the second laser beam 114b enters the hologram recording medium 111 as a reference beam 110. Here, the reference beam 110 is totally reflected at a boundary between the hologram recording medium 111 and the atmosphere, and travels through the prism 132.

In this manner, when the hologram recording medium 111 is illuminated with the object beam 109 and the reference beam 110 at the same time, a fringe pattern is formed in the hologram recording medium 111. That is, a hologram having the pattern of the original mask 108 is recorded in the hologram recording medium 111.

As the laser oscillator 101, a solid-state laser such as a YAG laser, a $YVO_4$ laser, a YLF laser, a $YAlO_3$ laser, or a $GdVO_4$ laser can be used. Specifically, a solid-state laser in which crystals such as YAQ $YVO_4$, YLF, $YAlO_3$, or $GdVO_4$ are doped with Cr, Nd, Er, Ho, Ce, Co, Ti, or Tm is used. Note that in the invention, the fundamental wave to the fifth harmonic of such solid-state laser oscillators are selectively used as appropriate. The harmonics relative to the fundamental wave can be obtained by using a nonlinear optical element.

Figure 4:
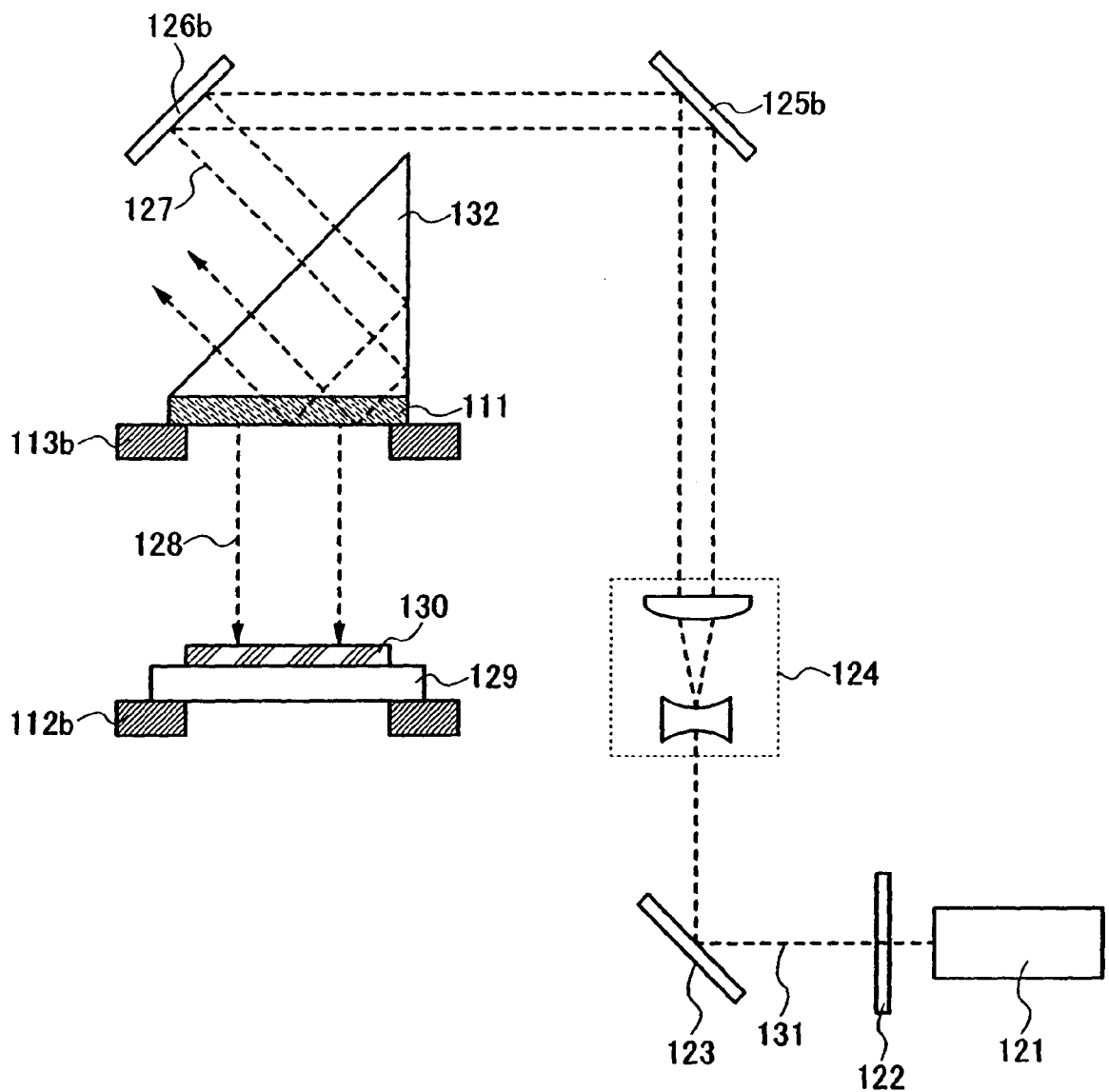
FIG. 4 shows an example of an exposure method of the invention.

Next, an exemplary step of reconstructing the hologram recorded in the hologram recording medium 111 which is formed in FIG. 3 by projecting the holographic image onto a resist (a reconstruction step) is shown in FIG. 4.

A laser beam emitted from a laser oscillator 121 is converted into a harmonic by a nonlinear optical element 122 to become a laser beam 131. The traveling direction of the laser beam 131 which has been converted into the harmonic is changed by a mirror 123. Then, the laser beam 131 is magnified by magnification optics 124. After that, the traveling direction of the laser beam 131 is changed by the mirrors 125a and 126a, and finally the laser beam 131 enters the hologram recording medium 111 as a reconstruction reference beam 127 through the prism 132. The reconstruction reference beam 127 which has entered the hologram recording medium 111 is diffracted by the fringe pattern formed in the hologram recording medium 111, and a part of the diffraction rays enters, as a reconstruction beam 128, a resist 130 which is provided over a substrate 129. Note that the same magnification optics and mirrors can be used for the magnification optics 124 and the mirrors 125a and 126b shown in FIG. 4 as for the magnification optics 104 and the mirrors 125a and 126a shown in FIG. 3.

Note also that here, the substrate 129 is disposed on a stage 112b and the hologram recording medium 111 having the fringe pattern is disposed on a stage 113b. In addition, the reconstruction reference beam 127 is controlled to enter the hologram recording medium 111 through the prism 132 from a direction opposite to the reference beam 110 shown in FIG. 3, and the resist 130 is disposed in the place where the original mask 108 shown in FIG. 3 was disposed.

In the reconstruction step shown in FIG. 4, a laser beam having a shorter wavelength than the first laser beam 114a and the second laser beam 114b which are used in the recording step shown in FIG. 3 is used as the laser beam 131, which is used for projecting the hologram recorded in the hologram recording medium 111 onto the resist 130. Further, the wavelength of the laser beam used as the laser beam 131 is equal to $1/(0.5 \times n)$ (where n is an integer not less than 3) the wavelengths of the first laser beam 114a and the second laser beam 114b. For example, a harmonic of the first laser beam 114a and second laser beam 114b which are used in the recording step can be used as the laser beam 131 which is used in the reconstruction step. That is, the same kind of laser oscillator as, or the same laser oscillator as, the laser oscillator 101 which is used in the recording step, is employed as the laser oscillator 121 which is used in the reconstruction step, and a laser beam emitted from the laser oscillator 121 is converted into a harmonic with the nonlinear optical element 122, as shown in FIG. 4. In addition, the stage 112b and the stage 113b can be identical to the stage 112a and the stage 113a which were used in the recording step shown in FIG. 3.

For example, in the recording step shown in FIG. 3, a $YVO_4$ laser is used as the laser oscillator 101, and the fundamental wave (wavelength: 1064 nm) of the $YVO_4$ laser is used as the first laser beam 114a and the second laser beam 114b. Meanwhile, in the reconstruction step shown in FIG. 4, a $YVO_4$ laser is used as the laser oscillator 121, and the fourth harmonic (wavelength: 266 nm) of the $YVO_4$ laser is used as the laser beam 131. In that case, the wavelength of the first laser beam 114a and the wavelength of the second laser beam 114b which are used in the recording step are four times that of the laser beam 131 which is used in the reconstruction step. Thus, a pattern with a size ¼ that of the pattern of the original mask 108 can be projected on the resist 130. Note that the laser oscillators are not limited to the $YVO_4$ laser. As long as the same kind of laser oscillator is used for the laser oscillator 101 as for the laser oscillator 121, any of the above-described solid-state lasers can be used.

Alternatively, it is also possible to use the second harmonic (wavelength: 532 nm) of the $YVO_4$ laser as the first laser beam 114a and the second laser beam 114b, and use the fourth harmonic (wavelength: 266 nm) of the $YVO_4$ laser as the laser beam 131. In that case, the wavelengths of the first laser beam 114a and the second laser beam 114b which are used in the recording step are twice that of the laser beam 131 which is used in the reconstruction step. Thus, a pattern with a size ½ that of the pattern of the original mask 108 can be projected on the resist 130.

In this manner, by using a laser beam which has a shorter wavelength than the first laser beam 114a and the second laser beam 114b, which is also a harmonic of the first laser beam 114a and the second laser beam 114b, as the third laser beam 131, a pattern with a size $1/(0.5 \times n)$ (where n is an integer not less than 3) that of the pattern of the original mask 108 can be projected on the resist 130. When laser oscillators capable of emitting laser beams in the range of the fundamental wave to the fifth harmonic are used as the laser oscillators 101 and 121, the resist 130 can be formed into a pattern with a size ¹⁄₁.₅, ½, ¹⁄₂.₅, ⅓, ¼, or ⅕ that of the pattern of the original mask 108, by combining the wavelengths of the laser beams emitted from the laser oscillator 101 and the laser oscillator 121.

For example, in order to form a 1 µm-width pattern in the resist 130, the pattern of the original mask 108 can be formed with a size of: 2 µm (in the case of using the fundamental wave for the recording step and using the second harmonic for the reconstruction step, or in the case of using the second harmonic for the recording step and using the fourth harmonic for the reconstruction step), 3 µm (in the case of using the fundamental wave for the recording step and using the third harmonic for the reconstruction step), 4 µm (in the case of using the fundamental wave for the recording step and using the fourth harmonic for the reconstruction step), or 5 µm (in the case of using the fundamental wave for the recording step and using the fifth harmonic for the reconstruction step), for example.

In this manner, in the exposure method using holography, by setting the wavelength of the laser beam used in the reconstruction step to be shorter than the wavelength of the laser beam used in the recording step, the original mask pattern can be reduced in size and projected on the resist. In addition, by using a harmonic having a shorter wavelength than the laser beam used in the recording step for the laser beam used in the reconstruction beam, a pattern with a size reduced to at least $1/(0.5 \times n)$ (where n is an integer not less than 3) that of the original mask pattern can be projected on the resist. As a result, the minimum unit of the dimensions of the pattern formed in the original mask or the resist can be reduced, which leads to a simplified layout design of the original mask. Furthermore, by reducing the minimum unit of the dimensions of the pattern formed in the resist, an alignment process and the like can be performed accurately when manufacturing a device by combining the holographic exposure method with another exposure method (e.g., a stepper or an MPA). The higher the number of manufacturing steps or the more a device is moisturized, the greater the advantageous effects of the invention.

Embodiment Mode 3

In this embodiment mode, an exposure method which is different from the above embodiment modes is described with reference to the drawings. Specifically, an exposure method using holography, where the recording step and the reconstruction step are conducted by using the same laser oscillator and the same exposure system, is described.

Figure 5:
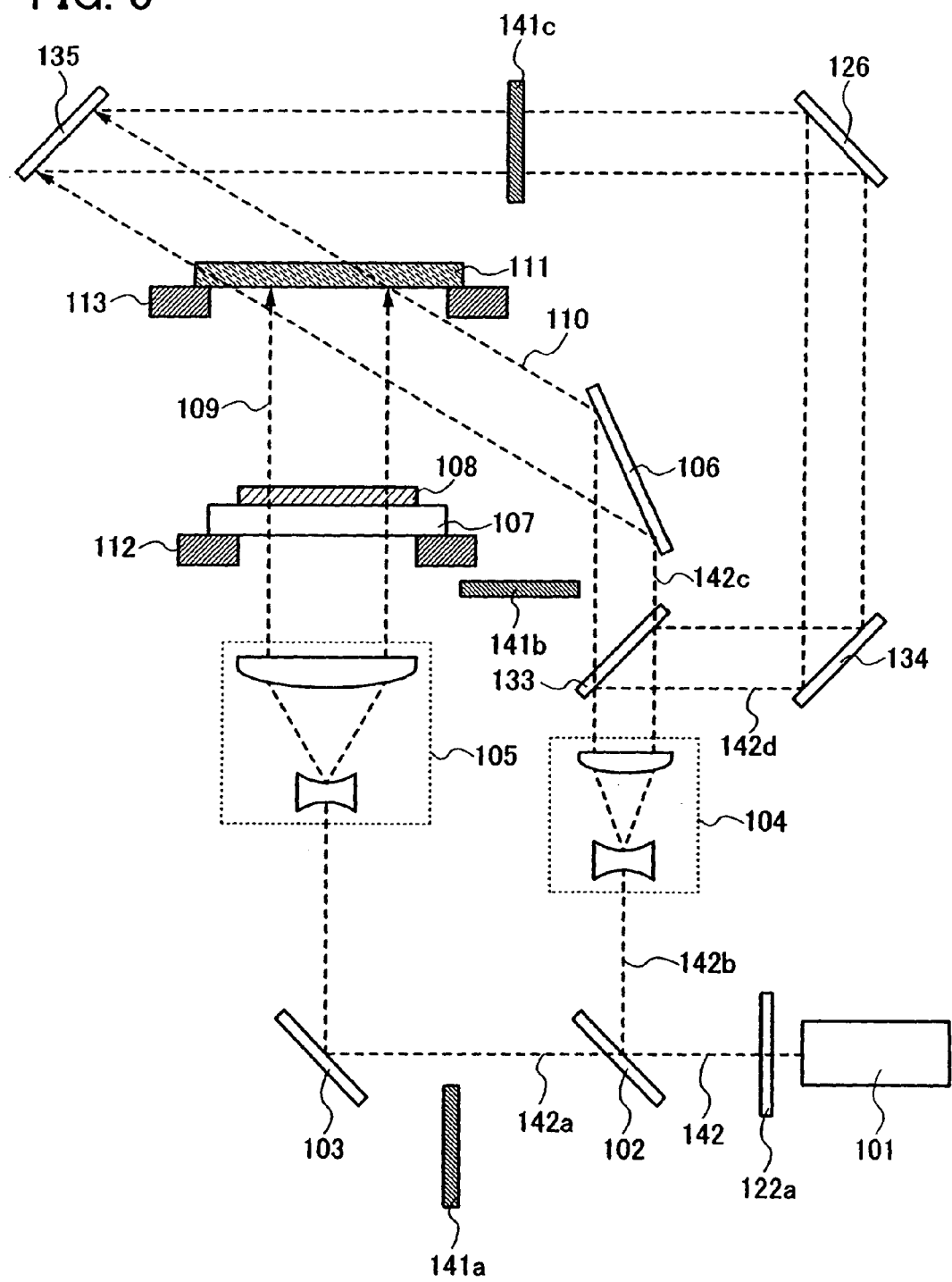
FIG. 5 shows an example of an exposure method of the invention.

First, an example of an exposure system used in this embodiment mode is shown in FIG. 5.

The exposure system shown in FIG. 5 includes a laser oscillator 101, a nonlinear optical element 122a for converting a laser beam emitted from the laser oscillator 101 into a harmonic, beam splitters 102 and 133 for splitting laser beams, mirrors 103, 106, 126, 134, and 135 for reflecting laser beams in desired directions, magnification optics 104 and 105 for magnifying the size of laser beams, stages 112 and 113, and shutters 141a to 141c for blocking laser beams.

The stages 112 and 113 are provided for positioning samples used in the exposure process, and the position of the stages 112 and 113 is adjustable in the vertical and horizontal directions. In the example shown herein, an original mask 108 formed over a substrate 107 is positioned on the stage 112, and a hologram recording medium 111 is positioned on the stage 113.

The shutters 141a to 141c are formed from materials which can block laser beams, and by opening or closing the shutters 141a to 141c, laser beams can be selectively blocked.

Next, the step of recording the pattern of the original mask 108 in the hologram recording medium 111 (the recording step) is described.

A laser beam emitted from the laser oscillator 101 is converted into a harmonic by the nonlinear optical element 122a to become a laser beam 142. Next, the laser beam 142 is split into laser beams at an appropriate intensity ratio by the beam splitter 102. Here, the laser beam is split into a first laser beam 142a and a second laser beam 142b. Note that in the case of using the fundamental wave in the recording step, the laser beam is controlled to directly enter the beam splitter 102 without passing through the nonlinear optical element 122a.

After that, the first laser beam 142a is magnified by the magnification optics 105. Then, the first laser beam 142a travels through the original mask 108 formed over the substrate 107, and finally enters the hologram recording medium 111 as an object beam 109. Meanwhile, the second laser beam 142b is magnified by the magnification optics 104, and then split into a third laser beam 142c and a fourth laser beam 142d by the beam splitter 133. The traveling direction of the third laser beam 142c is changed by the mirror 106, and then the third laser beam 142c enters the hologram recording medium 111 as a reference beam 110. The traveling direction of the fourth laser beam 142d is changed by the mirrors 134 and 126, and then the fourth laser beam 142d is blocked by the shutter 141c. In this embodiment mode, the beam splitter 133 may be a mirror with a movable structure, so that it does not block the optical path during the recording step.

In this manner, when the hologram recording medium 111 is illuminated with the object beam 109 and the reference beam 110 at the same time, a fringe pattern that is produced by optical interference between the object beam 109 and the reference beam 110 is formed in the hologram recording medium 111. That is, a hologram having the pattern of the original mask 108 is recorded in the hologram recording medium 111.

Note that in the recording step, the shutter 141a and the shutter 141b are in the open position (the state in which laser beams are not blocked), while the shutter 141c is in the closed position (the state in which laser beams are blocked).

Figure 6:
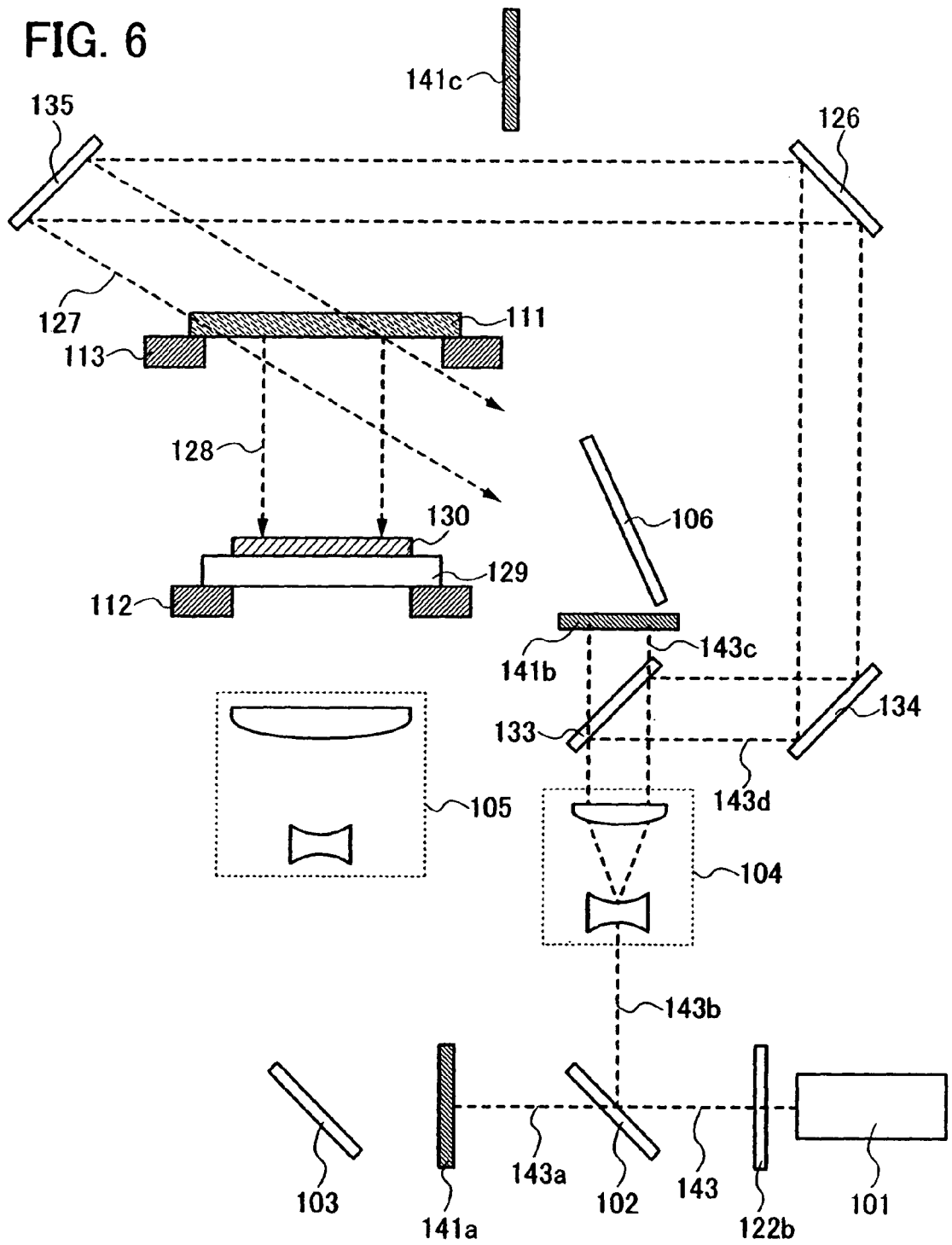
FIG. 6 shows an example of an exposure method of the invention.

Next, an exemplary step of reconstructing the hologram recorded in the hologram recording medium 111 which is formed in FIG. 5 by projecting the holographic image onto a resist (a reconstruction step) is shown in FIG. 6.

A laser beam emitted from the laser oscillator 101 which is used in the recording step in FIG. 5 is converted into a harmonic by a nonlinear optical element 122b to become a laser beam 143. The laser beam 143 is converted into the harmonic so that it has a shorter wavelength than the laser beam 142 used for the recording step. Next, the laser beam 143 is split into laser beams at an appropriate intensity ratio by the beam splitter 102. Here, the laser beam is split into a fifth laser beam 143a and a sixth laser beam 143b.

Then, the fifth laser beam 143a is blocked by the shutter 141a. The sixth laser beam 143b is magnified by the magnification optics 104, and then split into a seventh laser beam 143c and an eighth laser beam 143d by the beam splitter 133. The seventh laser beam 143c is blocked by the shutter 141b. Meanwhile, the traveling direction of the eighth laser beam 143d is changed by the mirrors 134, 126, and 135, and then the eighth laser beam 143d enters the hologram recording medium 111 as a reconstruction reference beam 127. The reconstruction reference beam 127 which has entered the hologram recording medium 111 is diffracted by the fringe pattern formed in the hologram recording medium 111, and a part of the diffraction rays enters, as a reconstruction beam 128, a resist 130 which is provided over a substrate 129. Note that here, the resist 130 is disposed on the stage 112, and the hologram recording medium 111 having the fringe pattern is disposed on the state 113. In addition, the reconstruction reference beam 127 is controlled to enter the hologram recording medium 111 from a direction opposite to the reference beam 110 shown in FIG. 5, and the resist 130 is disposed in the place where the original mask 108 shown in FIG. 5 was disposed.

Note that in the reconstruction step, the shutter 141a and the shutter 141b are in the closed position (the state in which laser beams are blocked), while the shutter 141c is in the open position (the state in which laser beams are not blocked).

In this manner, by providing the shutters 141a to 141c, an exposure method using holography, where the same laser oscillator and the same exposure system are used in the recording step and the reconstruction step, can be conducted.

Note that this embodiment mode can be freely implemented in combination with any of the above embodiment modes. For example, the exposure method shown in this embodiment mode can be replaced with total internal reflection holography.

Embodiment Mode 4

The exposure methods shown in the above embodiment modes can be replaced with an exposure method using a Fourier transform hologram. In the case of conducting an exposure process using a Fourier transform hologram, a laser beam emitted from a laser oscillator is split into a first laser beam and a second laser beam. Subsequently, the first laser beam is controlled to enter a hologram recording medium as an object beam through the original mask, while at the same time, the second laser beam is controlled to enter the hologram recording medium as a reference beam, so that a hologram is formed. At this time, a Fourier transform lens is provided between the original mask and the hologram recording medium, and the laser beam which has passed through the original mask is controlled to enter the hologram recording medium through the Fourier transform lens.

By conducting an exposure process using a Fourier transform hologram, the resolving power of a reconstructed image can be increased. With regard to the laser beams used in the recording step and the reconstruction step, the laser beam used in the reconstruction step has a shorter wavelength than the laser beam used in the recording step, as described in the above embodiment modes. Further, the wavelength of the laser beam used in the recording step is also $(0.5 \times n)$ (where n is an integer not less than 3) times that of the laser beam used in the reconstruction step. Alternatively, the same kind of laser oscillators can be used in the recording step and the reconstruction step. In that case, the laser beam used in the reconstruction step is made to have a shorter wavelength than the laser beam used in the recording step, and a harmonic can be used as the laser beam used in the reconstruction step.

In the invention, a hologram used in the holographic exposure method may be either an amplitude hologram or a phase hologram. In the case of using a phase hologram, the advantage of high diffraction efficiency can be provided. In addition, diffraction efficiency can be increased by forming a thick hologram.

Note that this embodiment mode can be freely implemented in combination with any of the above embodiment modes.

Embodiment Mode 5

In this embodiment mode, a method of manufacturing a semiconductor device using the exposure method shown in the above embodiment modes is described with reference to the drawings. Note that in this embodiment mode, although a cell of a static random access memory (SRAM) which includes six transistors is exemplarily shown, the present invention is not limited to this.

Figure 7:
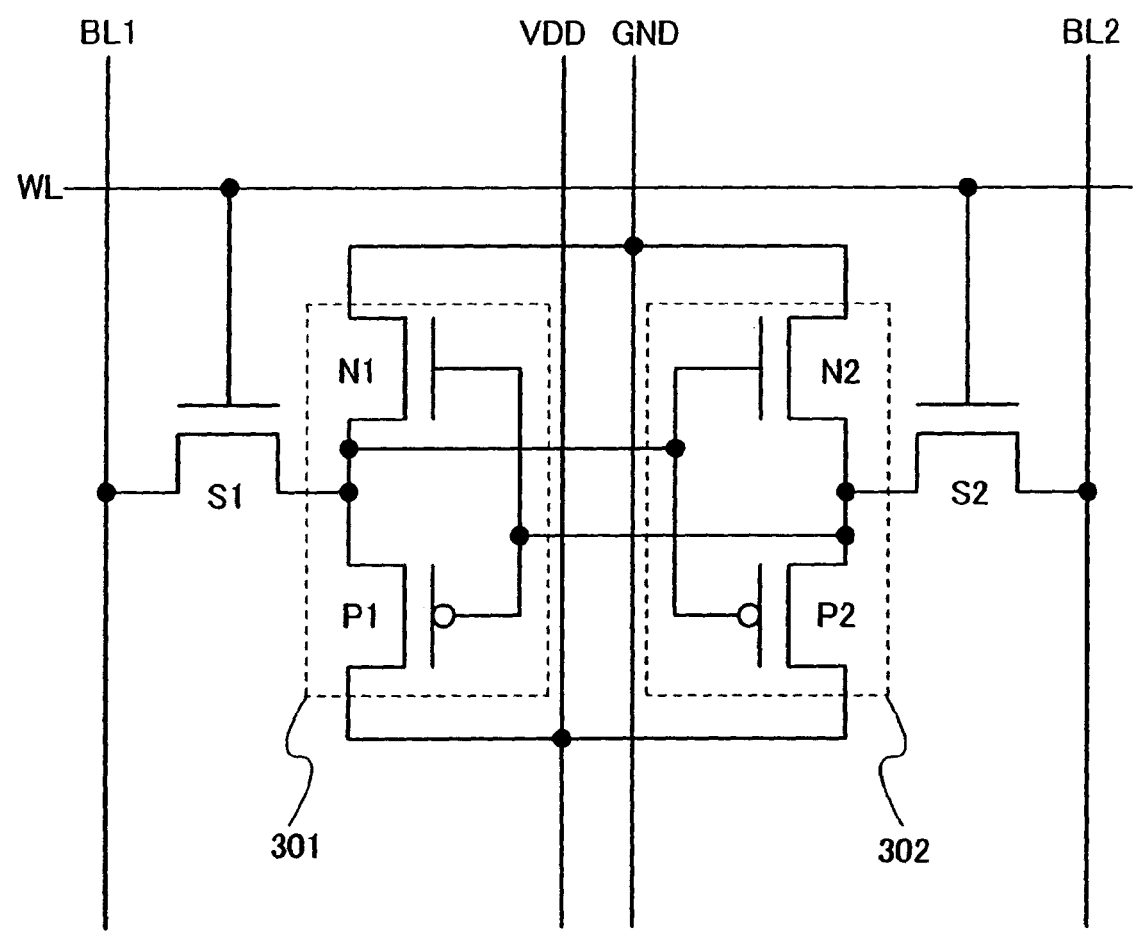
FIG. 7 shows an example of a method of manufacturing a semiconductor device using the exposure method of the invention.

The SRAM shown in this embodiment mode includes inverters 301 and 302, and the inputs of the inverters 301 and 302 are connected to bit lines BL1 and BL2 through switches S1 and S2, respectively (FIG. 7). The switches S1 and S2 are controlled by a row selection signal which is transmitted through a word line WL. Each of the inverters 301 and 302 is supplied with power by a high voltage VDD and a low voltage GND which is generally grounded. In order to write data into the memory cell, the voltage VDD is applied to one of the bit lines BL1 and BL2, while the voltage GND is applied to the other of the bit lines.

The inverter 301 includes an n-channel transistor N1 and a p-channel transistor P1 connected in series. The source of the p-channel transistor P1 is connected to the voltage VDD, and the source of the n-channel transistor N1 is connected to the voltage GND. The drains of the p-channel transistor P1 and the n-channel transistor N1 are connected to each other, and the gates of the p-channel transistor P1 and the n-channel transistor N1 are also connected to each other. Similarly, the inverter 302 includes a p-channel transistor P2 and an n-channel transistor N2 which are connected in series similarly to the p-channel transistor P1 and the n-channel transistor N1. The drains of the p-channel transistor P2 and the n-channel transistor N2 are connected to each other, and the gates of the p-channel transistor P2 and the n-channel transistor N2 are also connected to each other.

The SRAM shown in FIG. 7 is operated such that the switches S1 and S2 are turned on to set the input/output states of the inverters 301 and 302. Next, when the switches S1 and S2 are turned off, the signal states of the inverters 301 and 302 are retained. In order to read out data from the memory cell, each of the bit lines BL1 and BL2 is precharged to be in the voltage range from VDD to GND. When the switches S1 and S2 are turned on, voltages of the bit lines change in accordance with the signal states of the inverters 301 and 302. Data stored in the memory cell is read out by a sense amplifier which is connected to each bit line.

Figure 8:
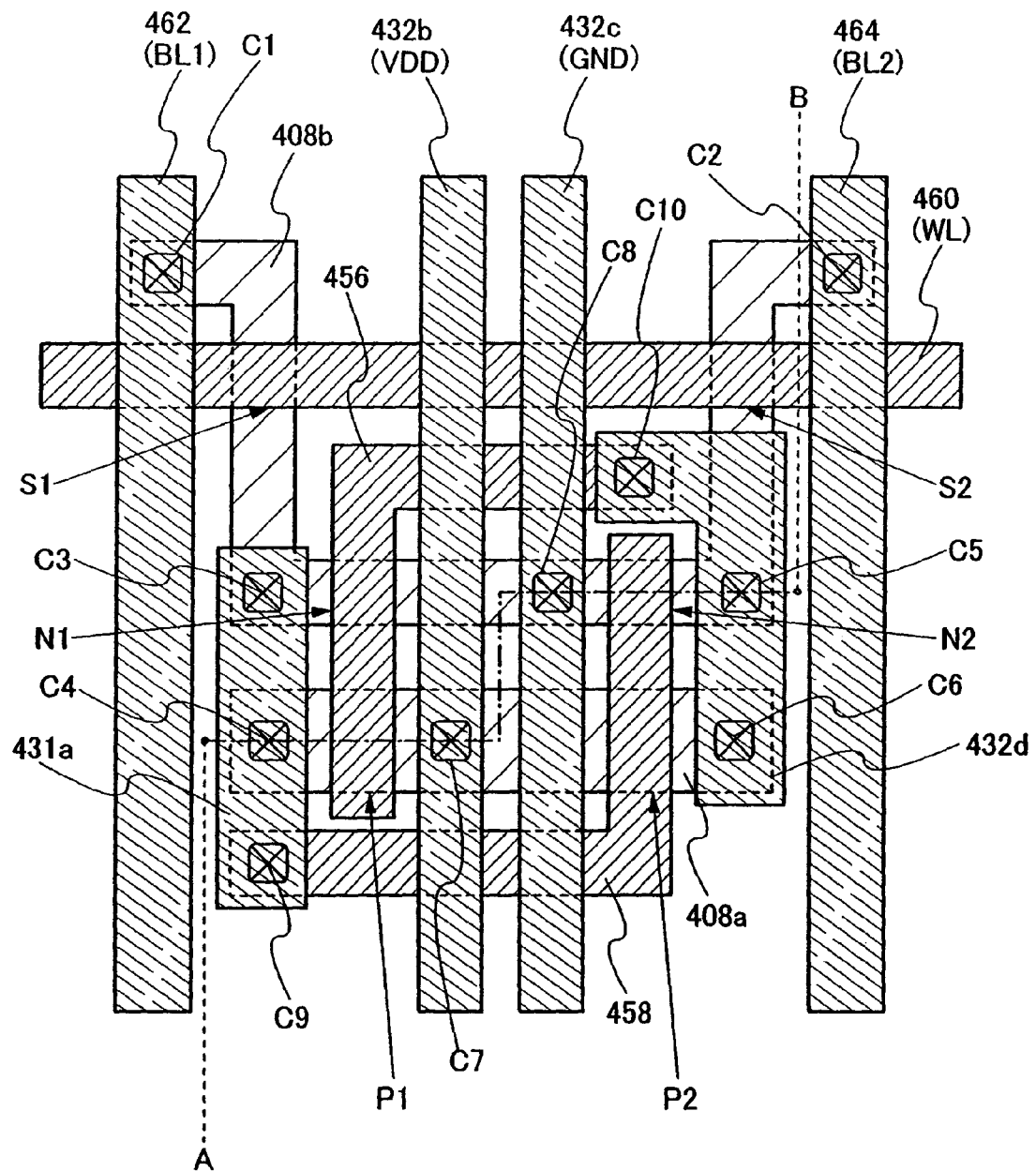
FIG. 8 shows an example of a method of manufacturing a semiconductor device using the exposure method of the invention.

FIG. 8 is an exemplary circuit layout of the SRAM shown in FIG. 7. FIG. 8 shows an SRAM which includes a semiconductor film and two wiring layers including a gate wiring layer. Given that a semiconductor film 408b for forming n-channel transistors and a semiconductor film 408a for forming p-channel transistors are located in the lower layer, first wiring layers 456, 458, and 460 are located above the lower layer with an insulating layer interposed therebetween. The first wiring layer 456 is a layer for forming gate electrodes, which forms the n-channel transistor N1 and the p-channel transistor P1 by intersecting the semiconductor films 408b and 408a, respectively. The first wiring layer 458 is a layer for forming gate electrodes, which forms the n-channel transistor N2 and the p-channel transistor P2 by intersecting the semiconductor films 408b and 408a, respectively. The first wiring layer 460 is a word line (WL), which forms the switches S1 and S2 by intersecting the semiconductor film 408b. In this manner, the first wiring layers 456, 458, and 460 form gate electrodes with the semiconductor films 408b and 408a.

Second wiring layers 462, 432b, 432c, and 464 are formed over the first wiring layers 456, 458, and 460 with an insulating layer interposed therebetween. The second wiring layer 462 forms a bit line (BL1); the second wiring layer 464 forms a bit line (BL2); the second wiring layer 432b forms a power supply line (VDD); and the second wiring layer 432c forms a ground potential line (GND).

A contact hole C1 is an opening formed in the insulating layer, which connects the second wiring layer 462 and the semiconductor film 408b. A contact hole C2 is an opening formed in the insulating layer, which connects the second wiring layer 464 and the semiconductor film 408a. A contact hole C3 is an opening formed in the insulating layer, which connects a second wiring layer 432a and the semiconductor film 408b. A contact hole C4 is an opening formed in the insulating layer, which connects the second wiring layer 432a and the semiconductor film 408a. A contact hole C5 is an opening formed in the insulating layer, which connects a second wiring layer 432d and the semiconductor film 408b. A contact hole C6 is an opening formed in the insulating layer, which connects the second wiring layer 432d and the semiconductor film 408a. A contact hole C7 is an opening formed in the insulating layer, which connects the second wiring layer 432b and the semiconductor film 408b. A contact hole C8 is an opening formed in the insulating layer, which connects the second wiring layer 432c and the semiconductor film 408a. A contact hole C9 is an opening formed in the insulating layer, which connects the second wiring layer 432a and the first wiring layer 458. A contact hole C10 is an opening formed in the insulating layer, which connects the second wiring layer 432d and the first wiring layer 456. In this manner, the SRAM shown in FIG. 8 is formed by the contact holes C1 to C10 which connect the semiconductor films, the first wiring layers, and the second wiring layers.

A manufacturing process of such an SRAM is described with reference to FIGS. 9A to 9C which are cross-sectional views along a line A-B (the p-channel transistor P1 and the n-channel transistor N2) of FIG. 8.

Figure 9A:
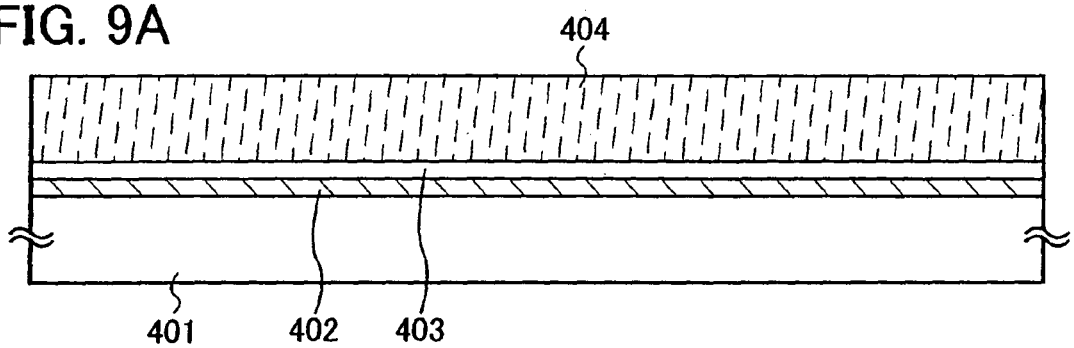
FIGS. 9A to 9C show an example of a method of manufacturing a semiconductor device using the exposure method of the invention.
Figure 9B:
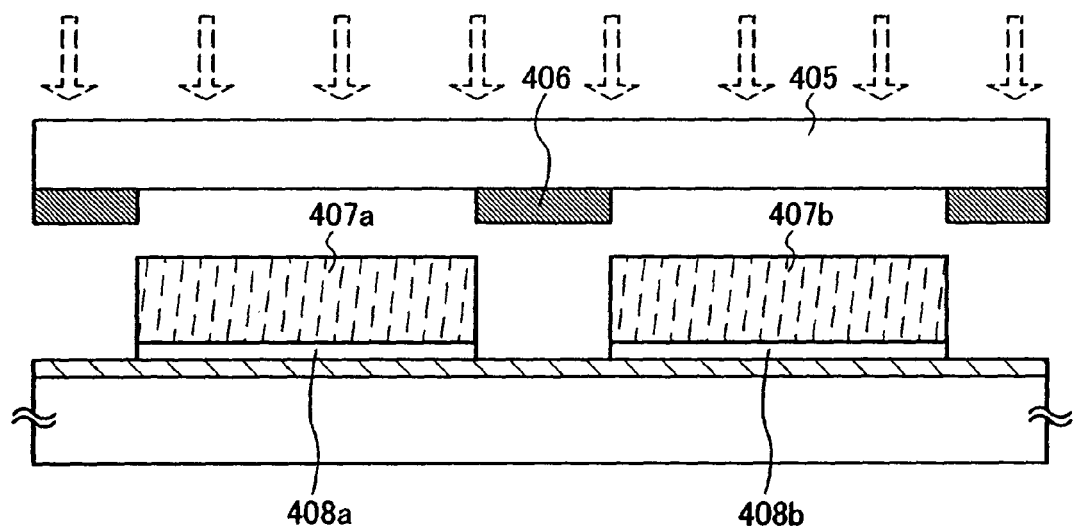
Figure 9C:
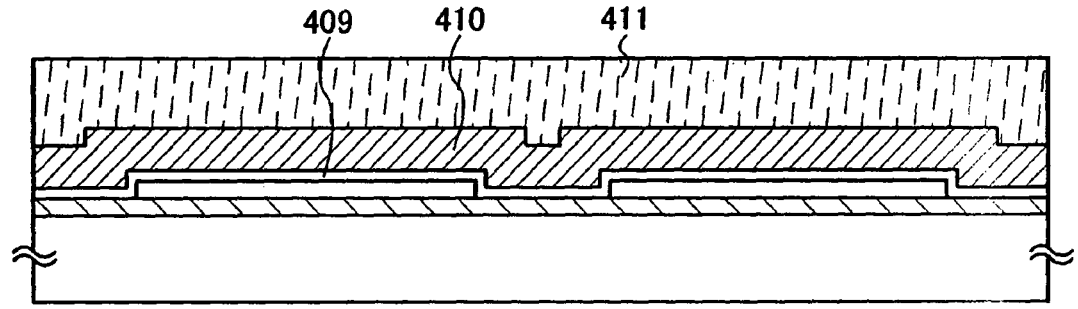

First, a semiconductor film 403 is formed over a substrate 401 with an insulating film 402 functioning as a base film interposed therebetween, and then a resist 404 is formed over the semiconductor film 403 (FIG. 9A).

The substrate 401 is selected from a glass substrate, a quartz substrate, a metal substrate (e.g., a ceramic substrate or a stainless steel substrate), a semiconductor substrate such as a S1 substrate, and the like. Alternatively, the substrate 401 can be a plastic substrate made of polyethylene terephthalate (PET), polyethylene naphthalate (PEN), polyethersulfone (PES), a substrate made of acrylic, or the like.

The insulating film 402 is formed by a CVD method, a sputtering method, or the like, using an insulating material such as silicon oxide, silicon nitride, silicon oxynitride ($SiO_xN_y$), (x>y>0), or silicon nitride oxide ($SiN_xO_y$) (x>y>0). For example, when the insulating film 402 is formed to have a two-layer structure, it is preferable to form a silicon nitride oxide film as a first-layer insulating film, and form a silicon oxynitride film as a second-layer insulating film. Alternatively, a silicon nitride film may be formed as a first-layer insulating film and a silicon oxide film may be formed as a second-layer insulating film. In this manner, formation of the insulating film 402 which functions as a blocking layer can prevent adverse effects of alkaline metals such as Na or alkaline earth metals contained in the substrate 401 which would otherwise be diffused into elements formed over the substrate. Note that when quartz is used for the substrate 401, the insulating film 402 may be omitted.

The semiconductor film 403 is preferably formed of a crystalline semiconductor film. The crystalline semiconductor film may be any of the following: a film obtained by crystallizing an amorphous semiconductor film formed over the insulating film 402, by thermal treatment or laser light irradiation; a film obtained by processing a crystalline semiconductor film formed over the insulating film 402 into an amorphous state, and then recrystallizing it again; and the like.

In the case of conducting crystallization or recrystallization by laser light irradiation, an LD-pumped continuous wave (CW) laser (e.g., $YVO_4$; a second harmonic (wavelength: 532 nm)) can be used as a laser light source. Although the frequency is not specifically limited to the second harmonic, the second harmonic is superior to harmonics higher than that in terms of energy efficiency. When a semiconductor film is irradiated with CW laser, continuous energy can be given to the semiconductor film. Therefore, once the semiconductor film is made into a molten state, the molten state can be retained. Furthermore, by scanning the semiconductor film with CW laser, a solid-liquid interface of the semiconductor film can be moved, and crystal grains which are long in one direction can be formed along the moving direction. The reason for using a solid-state laser is to obtain more stable output than with a gas laser or the like, and thus more stable treatment can be expected. Note that the laser light source is not limited to a CW laser, and a pulsed laser with a repetition rate of 10 MHz or higher can also be used. When a pulsed laser with a high repetition rate is used, a semiconductor film can be constantly retained in the molten state on the condition that the pulse interval of laser is shorter than the time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, as specific types of solid-state lasers, there are ceramic lasers such as a YAG laser, a $Y_2O_3$ laser, a $GdVO_4$ laser, and a $YVO_4$ laser. As a metal vapor laser, a helium-cadmium laser or the like can be given as an example. Laser beams are preferably emitted from a laser oscillator with $TEM_{00}$ (single transverse mode), which can increase the energy uniformity of a linear beam spot that is obtained on the irradiation surface. Besides, a pulsed excimer laser can also be used.

As the resist 404, a composition containing a photosensitizing agent may be used, which can be either a negative resist (a type of photoresist in which the portion of the photoresist exposed to light remains as a pattern after a development process) and a positive resist (a type of photoresist in which the portion of the photoresist that is unexposed to light remains as a pattern after a development process). Note that in this embodiment mode, a case of using a negative resist is shown.

Next, the resist 404 is exposed to light through a mask in which a metal 406 for selectively blocking light is provided on a light-transmissive film 405, and then the resist 404 is etched. Thus, the resist 404 is selectively removed to form a resist pattern. Then, a portion of the semiconductor film 403 that is not covered with the resist pattern is selectively removed, thereby island-shape semiconductor films are formed (FIG. 9B). Here, an example is shown where the resist 404 is selectively removed to form resists 407a and 407b, and a portion of the semiconductor film 403 that is not covered with the resists 407a and 407b is selectively removed to form the island-shape semiconductor films 408a and 408b. Here, light exposure for the resist 404 is conducted by an exposure method using a stepper, an MPA, or the like.

Next, a conductive film 410 is formed to cover the island-shape semiconductor films 408a and 408b with a gate insulating film 409 interposed therebetween. Then, a resist 411 is formed over the conductive film 410.

The gate insulating film 409 is formed using silicon oxide, silicon nitride, silicon oxynitride ($SiO_xN_y$) (x>y>0), silicon nitride oxide ($SiN_xO_y$) (x>y>0), or the like. Such an insulating layer is formed by a vapor growth method or a sputtering method. Alternatively, the gate insulating film 409 can be formed by performing high-density plasma treatment such as oxidation treatment or nitridation treatment to the surfaces of the semiconductor films 408a and 408b under an oxygen atmosphere (e.g., an atmosphere containing oxygen ($O_2$) and rare gas (at least one of He, Ne, Ar, Kr, and Xe), or an atmosphere containing oxygen, hydrogen ($H_2$), and rare gas); or a nitrogen atmosphere (e.g., an atmosphere containing nitrogen ($N_2$) and rare gas (at least one of He, Ne, Ar, Kr, and Xe), an atmosphere containing nitrogen, hydrogen, and rare gas, or an atmosphere containing $NH_3$ and rare gas). By forming the gate insulating film 409 by oxidizing or nitriding the surfaces of the semiconductor films 408a and 408b through the high-density plasma treatment, defect level density which would trap electrons or holes can be reduced.

The conductive film 410 is formed using a high-melting-point metal such as tungsten, molybdenum, titanium, tantalum, chromium, or niobium. Alternatively, an alloy of the above metal, conductive metal nitride, or conductive metal oxide can be used, such as an alloy of molybdenum and tungsten, titanium nitride, or tungsten nitride. As a further alternative, a stacked structure of tantalum nitride and tungsten can be used. It is also possible to use polysilicon which is doped with an impurity element such as phosphorus.

Figure 10A:
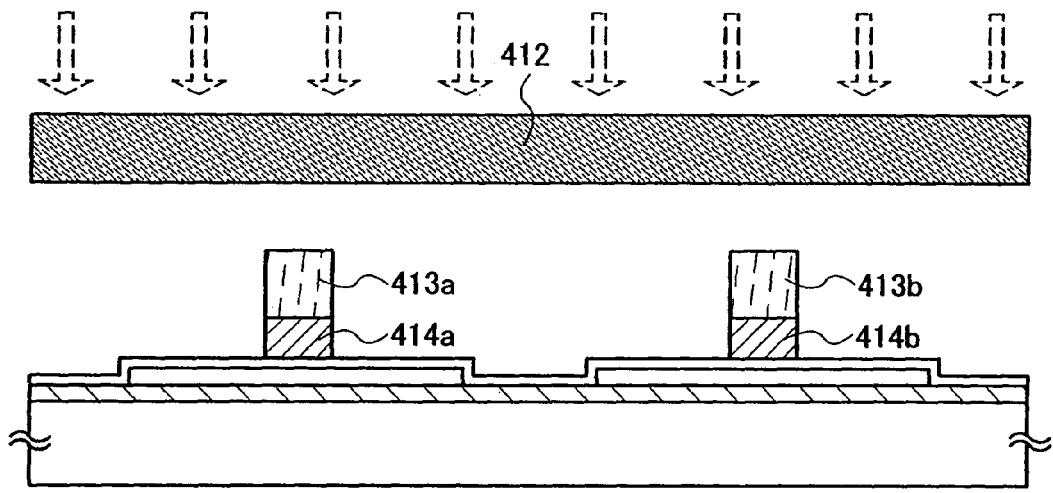
FIGS. 10A to 10C show an example of a method of manufacturing a semiconductor device using the exposure method of the invention.

Next, by exposing the resist 411 to light through a hologram recording medium 412 in which a hologram is formed, and etching the resist 411, the resist 411 can be selectively removed to form a resist pattern. Then, a portion of the conductive film 410 that is not covered with the resist pattern is selectively removed to form conductive films functioning as gate electrodes (FIG. 10A). Here, an example is shown where the resist 411 is selectively removed to form resists 413a and 413b, and a portion of the conductive film 410 that is not covered with the resists 413a and 413b is selectively removed to form gate electrodes 414a and 414b.

Note that the resists 413a and 413b which are used in forming the conductive films functioning as the gate electrodes 414a and 414b are formed by an exposure method using holography. Specifically, an exposure process is conducted through the steps of forming a fringe pattern in the hologram recording medium 412 by utilizing any of the recording steps shown in the above embodiment modes, and illuminating the resist 411 with a laser beam through the hologram recording medium 412 having the fringe pattern. Note that a harmonic of the laser beam which is used in the recording step for forming the fringe pattern in the hologram recording medium 412 is used as the laser beam for illuminating the resist 411.

By using holographic reduction-projection exposure, gate electrodes having a smaller pattern than the original mask pattern can be formed. As a result, the pattern of the semiconductor films 408a and 408b can be more miniaturized, thereby the degree of integration can be improved.

Figure 10B:
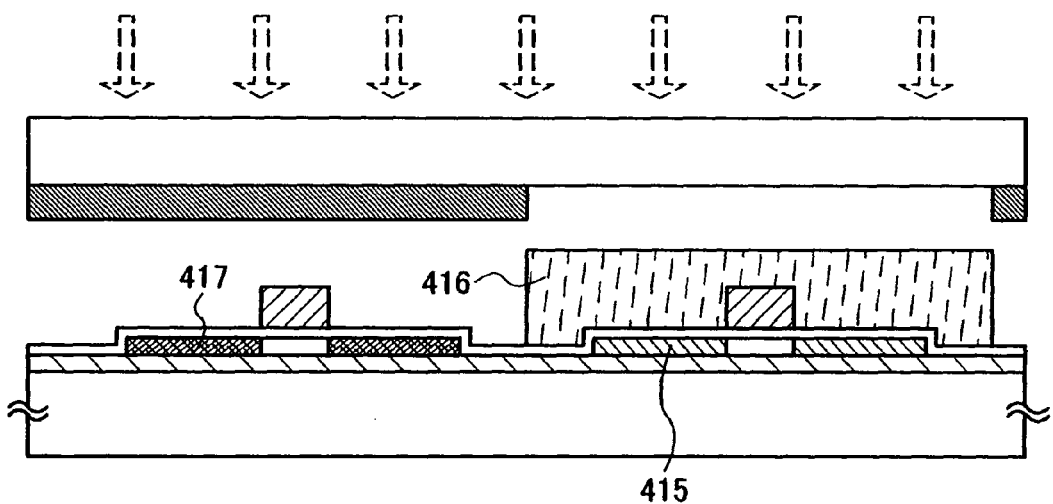

Next, the semiconductor films 408a and 408b are doped with an impurity element which imparts n-type conductivity at a low concentration, using the gate electrodes 414a and 414b and the resists 413a and 413b as masks or by using the gate electrodes 414a and 414b as masks. Thus, low-concentration impurity regions 415 are formed. After that, a resist 416 is selectively formed over the semiconductor film 408b and the gate electrode 414b, and the semiconductor film 408a is selectively doped with an impurity element which imparts p-type conductivity at a high concentration, using the gate electrode 414a as a mask (FIG. 10B). Through such steps, a channel region is formed in a part of the semiconductor film 408a which is located below the gate electrode 414a, and in the other regions of the semiconductor film 408a, p-type high-concentration impurity regions 417 functioning as a source region and a drain region are formed.

Figure 10C:
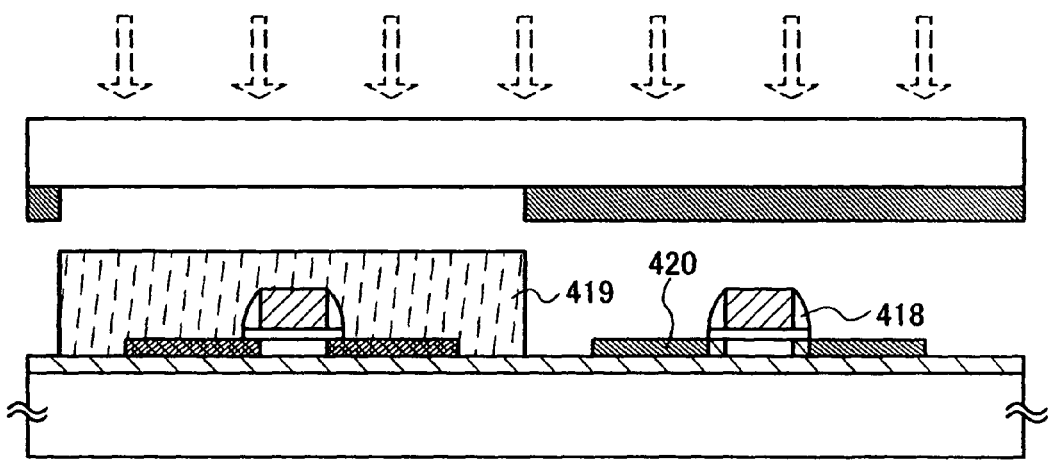

Next, after removing the resist 416, an insulating film is formed to cover the gate insulating film 409, the gate electrode 414a and the gate electrode 414b. The insulating film is formed to have either a single-layer structure or a stacked-layer structure by a CVD method, a sputtering method, or the like, using a layer containing an inorganic material such as silicon, silicon oxide, or silicon nitride, and/or a layer containing an organic material such as an organic resin. Next, the insulating layer is selectively etched by anisotropic etching (mainly in the perpendicular direction) to form insulating layers (also called sidewalls) 418 on opposite side surfaces of the gate electrode 414a and the gate electrode 414b. After that, a resist 419 is selectively formed over the semiconductor film 408a and the gate electrode 414a. Then, the semiconductor film 408b is selectively doped with an impurity element which imparts n-type conductivity at a high concentration, using as masks the gate electrode 414b and the insulating films 418 which have a contact with the side surfaces of the gate electrode 414b (FIG. 10C). Through such steps, a channel region is formed in a part of the semiconductor film 408b which is located below the gate electrode 414b, and low-concentration impurity regions (all called LDD regions: Lightly Doped Drain regions) having n-type conductivity are formed in a part of the semiconductor film 408b which is located below the insulating films 418. In addition, high-concentration impurity regions 420 having n-type conductivity, which function as a source region and a drain region, are formed in the other regions of the semiconductor film 408b.

Figure 11A:
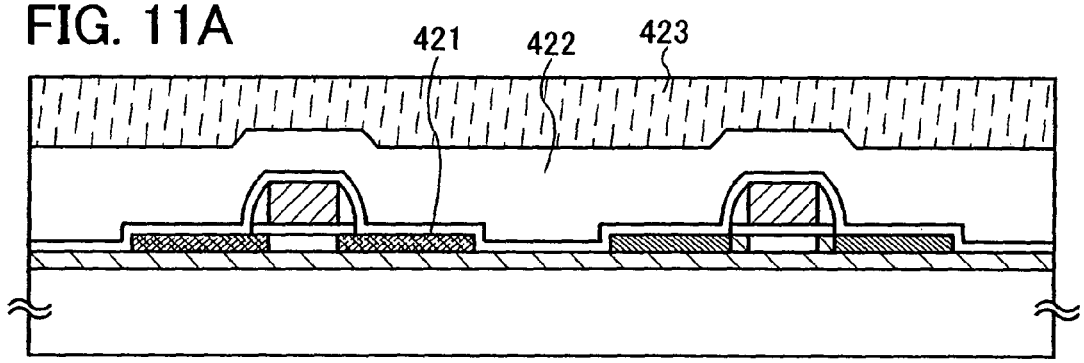
FIGS. 11A to 11C show an example of a method of manufacturing a semiconductor device using the exposure method of the invention.

Next, an insulating film is formed to cover the semiconductor films 408a and 408b and the gate electrodes 414a and 414b. Then, a resist is formed over the insulating film (FIG. 11A). Here, an example is shown where insulating films 421 and 422 are stacked as the insulating film, and then a resist 423 is formed over the insulating film 422.

Figure 11B:
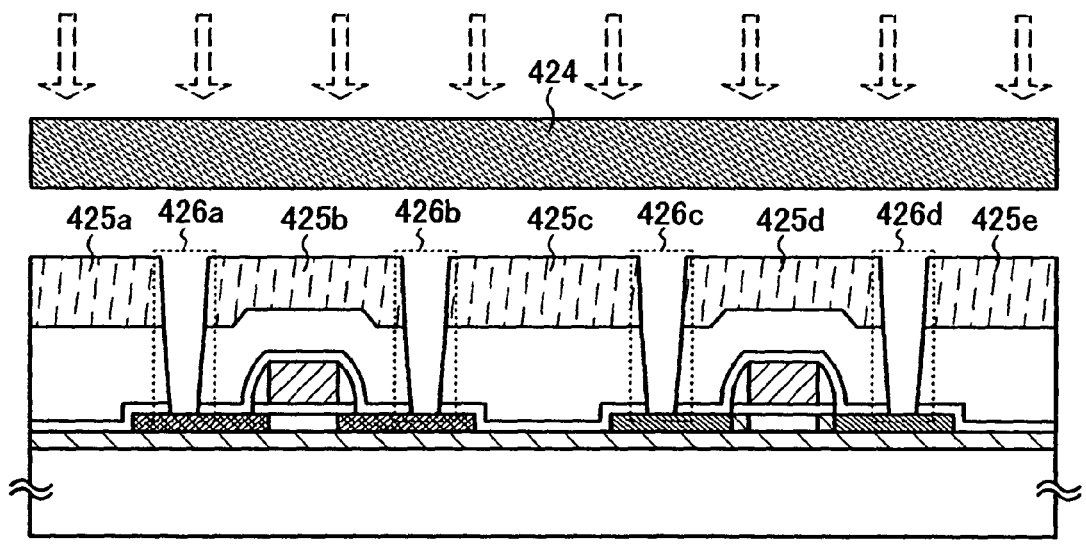

The insulating films 421 and 422 can be formed by a CVD method, a sputtering method, or the like, using silicon oxide, silicon oxynitride ($SiO_xN_y$) (x>y>0), silicon nitride oxide ($SiN_xO_y$) (x>y>0), or the like. Alternatively, the insulating films 421 and 422 can be formed to have a single-layer structure or a stacked-layer structure including an organic material such as polyimide, polyamide, polyvinyl phenol, benzocyclobutene, acrylic, or epoxy; a siloxane material such as siloxane resin; oxazole resin; and the like. Note that siloxane is a material having a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Oxazole resin includes, for example, photosensitive polybenzoxazole or the like. Photosensitive polybenzoxazole is a material having a low dielectric constant (dielectric constant of 2.9 at 1 MHz at room temperature), high heat resistance (thermal decomposition temperature of 550° C. with a temperature rise of 5° C./min by TGA (Thermal Gravity Analysis)), and low water absorption (0.3% in 24 hours at room temperature). Oxazole resin has a lower dielectric constant (approximately 2.9) as compared with a dielectric constant of polyimide or the like (approximately 3.2 to 3.4). Therefore, generation of parasitic capacitance can be suppressed and high-speed operation can be performed. Here, the insulating film 421 is formed by a CVD method using silicon oxide, silicon oxynitride ($SiO_xN_y$) (x>y>0), or silicon nitride oxide ($SiN_xO_y$) (x>y>0), while the insulating film 422 is formed using an organic material such as polyimide, polyamide, polyvinyl phenol, benzocyclobutene, acrylic, or epoxy; a siloxane material such as siloxane resin; oxazole resin; and the like Next, by exposing the resist 423 to light through a hologram recording medium 424 in which a hologram is formed, and etching the resist 423, the resist 423 is selectively removed to form a resist pattern. Then, a portion of the insulating films 421 and 422 that is not covered with the resist pattern is selectively removed to expose the semiconductor films 408a and 408b (FIG. 11B). Here, an example is shown where resists 425a to 425e are formed by selectively removing the resist 423, and a portion of the insulating films 421 and 422 that is not covered with the resists 425a to 425e is selectively removed to form contact holes 426a to 426e.

By using holographic reduction-projection exposure, contact holes having smaller diameters than the original mask pattern can be formed. As a result, the area in which the semiconductor film 408a forms a contact with conductive films 431a and 431b, and the area in which the semiconductor film 408b forms a contact with conductive films 431c and 431d can be reduced. Accordingly, the distance between each of the contact holes 426a to 426d can be narrowed, and thus the degree of integration can be improved.

Figure 11C:
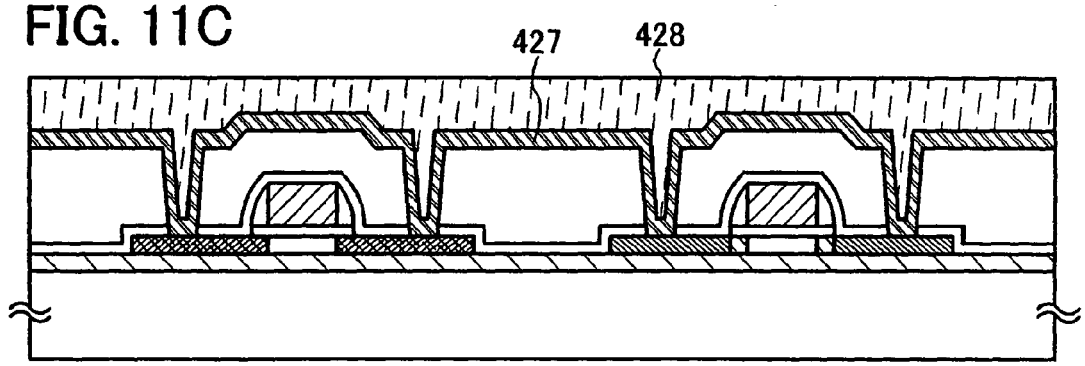

Next, a conductive film 427 is formed to fill at least the contact holes 426a to 426d, and a resist 428 is formed over the conductive film 427 (FIG. 11C).

The conductive film 427 can be formed to have either a single-layer structure or a stacked-layer structure of an element selected from aluminum, tungsten, titanium, tantalum, molybdenum, nickel, and neodymium (Nd), or an alloy containing a plurality of such elements. For example, as a conductive film which is made of an alloy containing a plurality of the above-described elements, it is possible to form an aluminum alloy containing titanium, an aluminum alloy containing neodymium, or the like. In the case of forming a stacked-layer structure, for example, a structure where an aluminum layer or the above-described aluminum alloy layer is sandwiched between titanium layers can be used. The conductive film 431b forms the power supply line (VDD), while the conductive film 431c forms the ground potential line (GND).

Figure 12A:
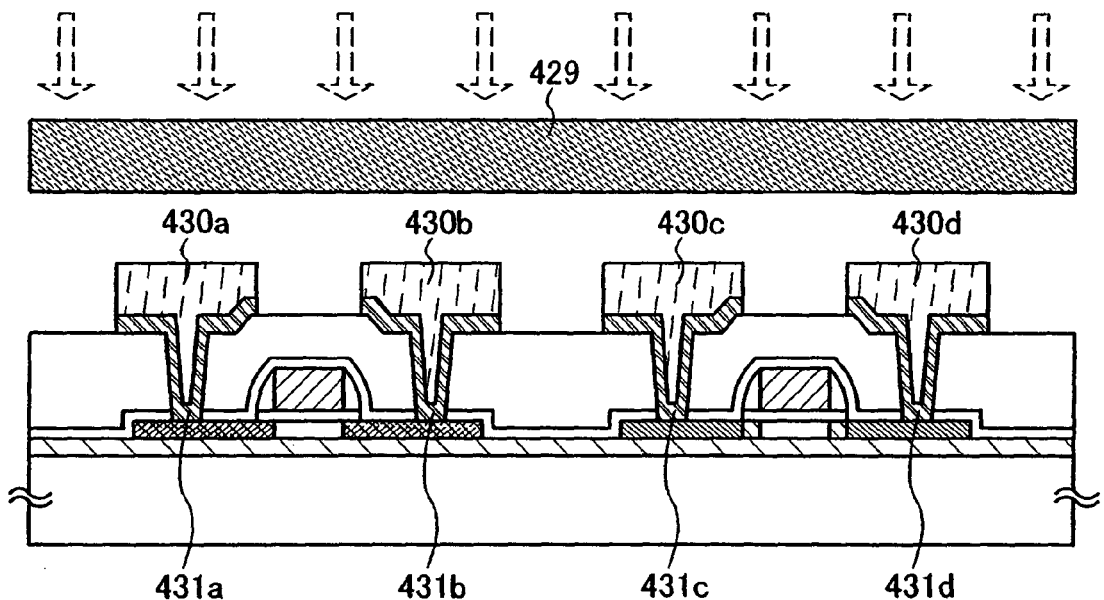
FIGS. 12A and 12B show an example of a method of manufacturing a semiconductor device using the exposure method of the invention.

Next, by exposing the resist 428 to light through a hologram recording medium 429 in which a hologram is formed, and etching the resist 428, the resist 428 can be selectively removed to form a resist pattern. Then, a portion of the conductive film 427 that is not covered with the resist pattern is selectively removed to form a conductive film functioning as a source electrode or a drain electrode (FIG. 12A). Here, an example is shown where resists 430a to 430d are formed by selectively removing the resist 428, and a portion of the conductive film 427 that is not covered with the resists 430a to 430*d* is selectively removed to form the conductive films 431*a* to 431*b* functioning as the source electrodes or the drain electrodes.

By using holographic reduction-projection exposure, contact holes having smaller diameters than the original mask pattern can be formed. As a result, the area in which the semiconductor film 408*a* forms a contact with conductive films 431*a* and 431*b*, and the area in which the semiconductor film 408*b* forms a contact with conductive films 431*c* and 431*d* can be reduced. Accordingly, the distance between each of the contact holes 426*a* to 426*d* can be narrowed, and thus the degree of integration can be improved.

Figure 12B:
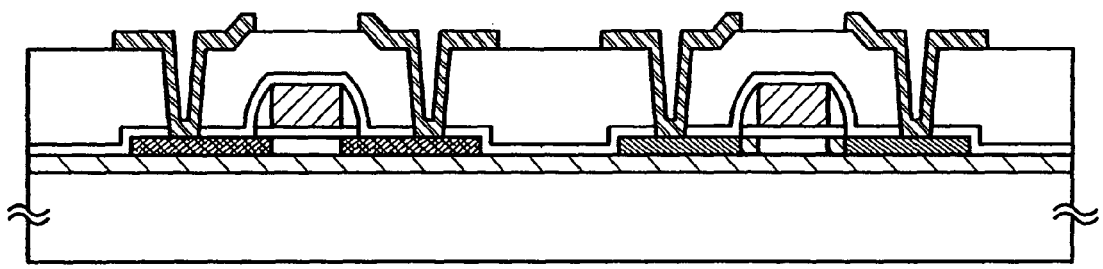

Then, the resists 430*a* to 430*d* are removed. Then, transistors can be formed (FIG. 12B). In this manner, by using the holographic exposure method shown in Embodiment Modes 1 to 4 for the process of manufacturing a semiconductor device, an alignment process can be conducted accurately in forming micropatterns even in combination with another exposure method.

Although this embodiment mode has illustrated an example where a holographic exposure method is applied to the formation of gate electrodes, contact holes, and source or drain electrodes, the present invention is not limited to these, and the holographic exposure method may be applied to all of the steps including the formation of island-shape semiconductor films and the like, or may be applied to only the formation of gate electrodes. That is, the holographic exposure method may be applied to at least one of the steps included in the process of manufacturing a semiconductor device.

Note that this embodiment mode can be freely implemented in combination with any of the above embodiment modes.

Embodiment Mode 6

In this embodiment mode, examples of the application of a semiconductor device which is obtained by using the manufacturing method shown in Embodiment Mode 5 are described. Specifically, examples of the application of a semiconductor device which can perform wireless data communication are described with reference to the drawings. A semiconductor device which can perform wireless data communication is also called an RFID tag, an ID tag, an IC tag, an IC chip, an RF tag, a wireless tag, an electronic tag, or a wireless chip depending on the use application.

Figure 13A:
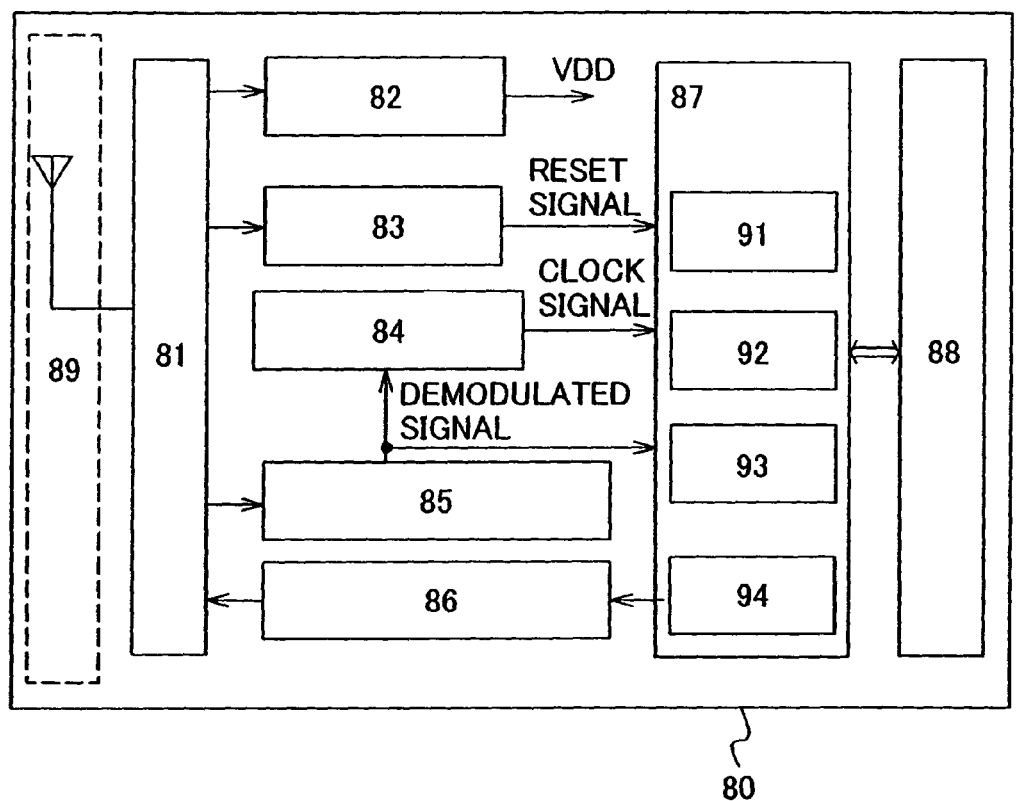
FIGS. 13A to 13C show examples of the application of a semiconductor device which is manufactured using the exposure method of the invention.

A semiconductor device 80 has a function of wireless data communication, and includes a high-frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 13A). The high-frequency circuit 81 is a circuit which receives signals from the antenna 89, and outputs signals which have been received from the data modulation circuit 86 to the antenna 89; the power supply circuit 82 is a circuit which generates power supply potentials from received signals; the reset circuit 83 is a circuit which generates reset signals; the clock generation circuit 84 is a circuit which generates various clock signals based on the received signals which have been input from the antenna 89; the data demodulation circuit 85 is a circuit which demodulates the received signals and outputs them to the control circuit 87; and the data modulation circuit 86 is a circuit which modulates the signals received from the control circuit 87. In addition, the control circuit 87 includes a code extraction circuit 91, a code judging circuit 92, a CRC judging circuit 93, and an output unit circuit 94. Note that the code extraction circuit 91 is a circuit which extracts a plurality of codes contained in the instructions transmitted to the control circuit 87; the code judging circuit 92 is a circuit which judges the content of the instructions by comparing the extracted code with a reference code; and the CRC circuit 93 is a circuit which detects the presence of transmission errors and the like based on the judged code.

In FIG. 13A, the semiconductor circuit 80 also includes the high-frequency circuit 81 and the power supply circuit 82 that are analog circuits, in addition to the control circuit 87. Even for such circuits, a holographic exposure method can be used as described in the above embodiment modes. By using such an exposure method, the size of the transistors can be reduced. Therefore, the chip size can be reduced even when a glass substrate or the like that has low planarity is used.

Next, an example of the operation of the above semiconductor device is described. First, the antenna 89 receives a radio signal. The radio signal is transmitted to the power supply circuit 82 through the high-frequency circuit 81, and the power supply circuit 82 generates a high power supply potential (hereinafter referred to as VDD). VDD is supplied to each circuit included in the semiconductor device 80. In addition, a signal transmitted to the data demodulation circuit 85 through the high-frequency circuit 81 is demodulated (hereinafter the signal is referred to as a demodulated signal). Furthermore, a signal (a reset signal) transmitted to the reset circuit 83 through the high-frequency circuit 81, a signal (a clock signal) transmitted to the clock generation circuit 84 and the demodulated signal are transmitted to the control circuit 87. The signals transmitted to the control circuit 87 are analyzed by the code extraction circuit 91, the code judging circuit 92, the CRC judging circuit 93, and the like. Then, data on the semiconductor device which is stored in the memory circuit 88 is output in response to the analyzed signal. The output data of the semiconductor device is encoded in the output unit circuit 94. Furthermore, the encoded data of the semiconductor device 80 is modulated in the data modulation circuit 86, and superposed on a radio signal to be transmitted through the antenna 89. Note that the low power supply potential (hereinafter referred to as VSS) is common to the plurality of circuits which form the semiconductor device 80; therefore, GND can be used as the VSS.

In this manner, by transmitting signals to the semiconductor device 80 from a reader/writer and transmitting signals from the semiconductor device 80 to the reader/writer, data on the semiconductor device can be read out.

The semiconductor device 80 may be either of a type where no power supply (battery) is mounted but electromagnetic waves are used to supply a power supply voltage to each circuit, or of a type where both electromagnetic waves and a power supply (battery) are used to supply a power supply voltage to each circuit.

Figure 13B:
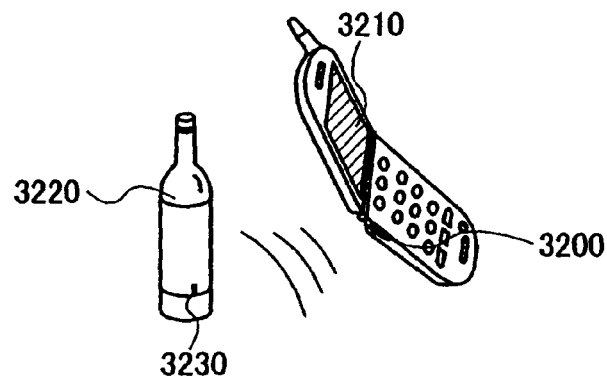
Figure 13C:
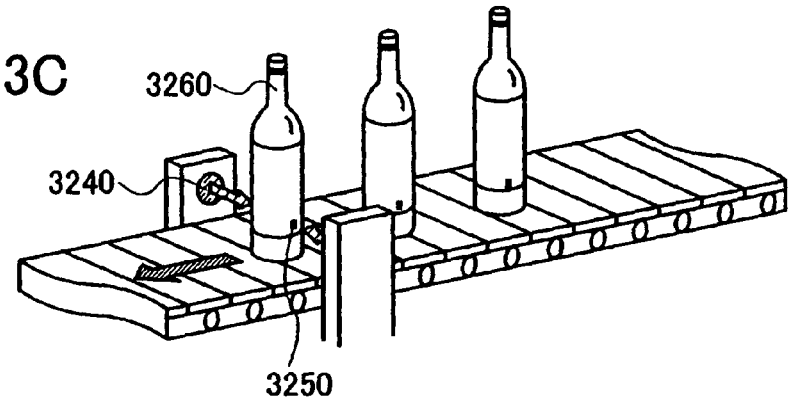
Figure 14A:
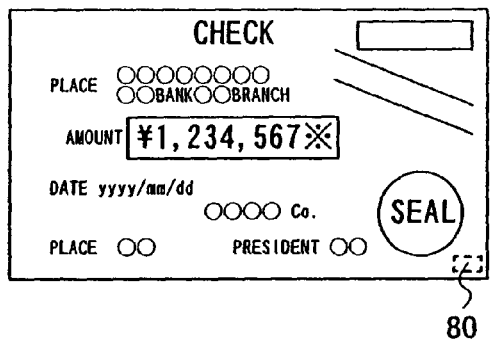
FIGS. 14A to 14H show examples of the application of a semiconductor device which is manufactured using the exposure method of the invention.
Figure 14B:
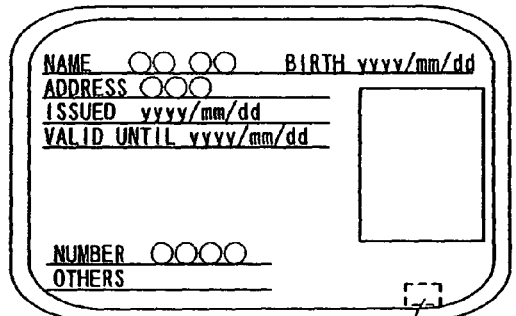
Figure 14C:
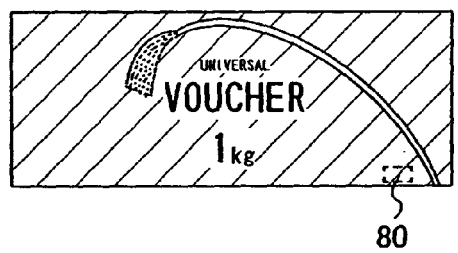
Figure 14D:
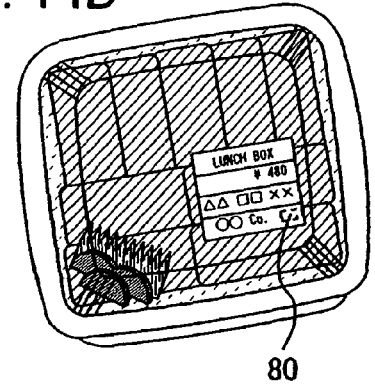
Figure 14E:
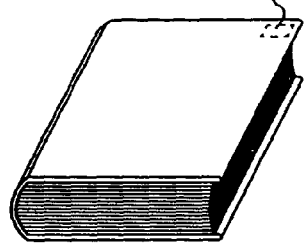
Figure 14F:
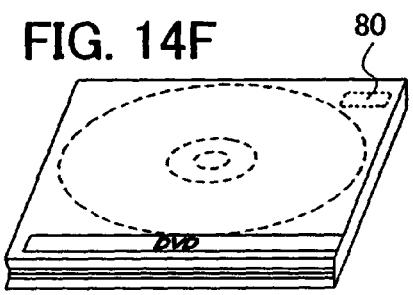
Figure 14G:
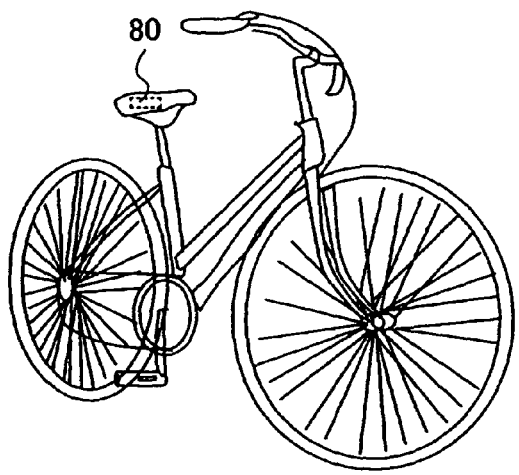
Figure 14H:
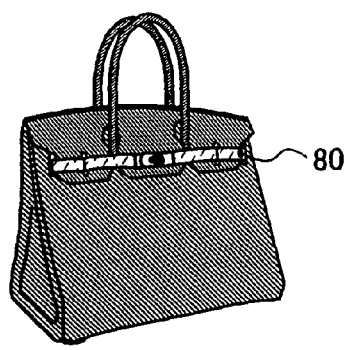

Next, examples of the application of the semiconductor device which can perform wireless data communication are described. A side surface of a portable terminal which includes a display portion 3210 is provided with a reader/writer 3200, and a side surface of a product 3220 is provided with a semiconductor device 3230 (FIG. 13B). When the reader/writer 3200 is put close to the semiconductor device 3230 on the product 3220, data on the raw material or the source of the product, inspection result in each production step, history of the distribution process, product description, and the like is displayed on the display portion 3210. In addition, when carrying a product 3260 on a belt conveyor, inspection of the product 3260 can be conducted by using a reader/writer 3240 and a semiconductor device 3250 provided to the product 3260 (FIG. 13C). In this manner, by using the semiconductor device for a system, data acquisition can be easily conducted, and thus a higher function and higher added value can be realized.

In addition to the above examples, a semiconductor device which is manufactured using the exposure method of the present invention can be applied to various uses, and it can be applied to any product which can wirelessly obtain data on an object such as a history thereof and which can be utilized in production, management, and the like. For example, such a semiconductor device may be incorporated in bills, coins, securities, certificates, bearer bonds, packaging containers, books, storage media, personal belongings, vehicles, foods, clothes, healthcare items, everyday articles, medicals, and electronic devices. Examples of these products are described with reference to FIGS. 14A to 14H.

The bills and coins include currency in the market and include notes that are circulating as the real money in specific areas (cash voucher), memorial coins, and the like. The securities include checks, certificates, promissory notes, and the like (see FIG. 14A). The certificates include driver's licenses or resident's cards, and the like (see FIG. 14B). The bearer bonds include stamps, rice coupons, various gift coupons, and the like (see FIG. 14C). The packaging containers include paper for wrapping a lunch box or the like, plastic bottles, and the like (see FIG. 14D). The books include documents and the like (see FIG. 14E). The storage media include DVD software, video tapes, and the like (see FIG. 14F). The means of transportation include wheeled cycles or vehicles such as bicycles, vessels, and the like (see FIG. 14G). The personal belongings include bags, glasses, and the like (see FIG. 14H). The foods include food items, beverages, and the like. The clothes include clothing, footwear, and the like. The healthcare items include medical devices, health appliances, and the like. The everyday articles include furniture, lighting apparatuses, and the like. The medicals include medicines, agricultural chemicals, and the like. The electronic devices include liquid crystal display devices, EL display devices, television sets (television receivers or thin television receivers), mobile phones, and the like.

When the semiconductor device 80 is provided for bills, coins, securities, certificates, bearer bonds, and the like, forgery of them can be prevented. When the semiconductor device 80 is provided for packaging containers, books, storage media, personal belongings, foods, everyday articles, electronic devices, and the like, efficiency of an inspection system, a system of a rental shop, and the like can be improved. When the semiconductor device 80 is provided for means of transportation, healthcare items, medicals, and the like, forgery and theft of them can be prevented and wrong use of the medicines can be prevented. The semiconductor device 80 may be attached to the surface of a product or incorporated into a product. For example, the semiconductor device 80 may be incorporated into paper of a book or an organic resin of a package. By providing a minute semiconductor device which is formed using the exposure method described in the above embodiment modes, damage on the elements included in the semiconductor device can be prevented even when the semiconductor device is mounted on paper or the like.

Thus, when the semiconductor device is provided for packaging containers, storage media, personal belongings, foods, clothes, everyday articles, electronic devices, and the like, efficiency of an inspection system, a system of a rental shop, and the like can be increased. When the semiconductor device is provided for cycles or vehicles, forgery and theft of them can be prevented. In addition, when the semiconductor device is implanted into creatures such as animals, each creature can be easily identified. For example, when a semiconductor device with a sensor is implanted into creatures such as domestic animals, not only the year of birth, sex, breed, species, and the like but also the health conditions such as the current body temperature can be easily managed.

Note that this embodiment mode can be freely implemented in combination with any of the above embodiment modes.

The present application is based on Japanese Priority application No. 2006-038027 filed on Feb. 15, 2006 with the Japanese Patent Office, the entire contents of which are hereby incorporated by reference.

What is claimed is:

1. An exposure method comprising the steps of:
splitting a laser beam emitted from a first laser oscillator into a first laser beam and a second laser beam;
illuminating a hologram recording medium with the first laser beam through a mask having a first pattern while illuminating the hologram recording medium with the second laser beam, thereby recording a hologram with the first pattern in the hologram recording medium;
illuminating the hologram recording medium in which the hologram is recorded with a third laser beam which is emitted from a second laser oscillator; and
delivering the third laser beam which has passed through the hologram recording medium onto a resist by using an optics configured to reduce a size of the first pattern, thereby forming a second pattern in the resist,
wherein a wavelength of the third laser beam is shorter than wavelengths of the first laser beam and the second laser beam, and
wherein the wavelength of the third laser beam is $1/(0.5 \times n)$ (where n is an integer not less than 3) of that of the first laser beam and the second laser beam.

2. The exposure method according to claim 1, wherein fundamental waves are used as the first laser beam and the second laser beam, and a harmonic is used as the third laser beam.

3. The exposure method according to claim 1, wherein fundamental waves are used as the first laser beam and the second laser beam, and a third harmonic is used as the third laser beam.

4. The exposure method according to claim 1, wherein harmonics are used as the first laser beam, the second laser beam, and the third laser beam.

5. The exposure method according to claim 1, wherein second harmonics are used as the first laser beam and the second laser beam, and a third harmonic is used as the third laser beam.

6. The exposure method according to claim 1, wherein a solid-state laser oscillator is used as each of the first laser oscillator and the second laser oscillator.

7. The exposure method according to claim 1, wherein a YAG laser oscillator, a $YVO_4$ laser oscillator, a YLF laser oscillator, a $YAlO_3$ oscillator, or a $GdVO_4$ laser oscillator is used as each of the first laser oscillator and the second laser oscillator.

8. The exposure method according to claim 1, wherein the first laser beam passes through a fourier transform lens provided between the hologram recording medium and the mask at the step of recording the hologram.

9. An exposure method comprising the steps of:
splitting a laser beam emitted from a first laser oscillator into a first laser beam and a second laser beam;
illuminating a hologram recording medium with the first laser beam through a mask having a first pattern while illuminating the hologram recording medium with the second laser beam, thereby recording a hologram with the first pattern in the hologram recording medium;

illuminating the hologram recording medium in which the hologram is recorded with a third laser beam which is emitted from a second laser oscillator; and delivering the third laser beam which has passed through the hologram recording medium onto a resist by using an optics configured to reduce a size of the first pattern, thereby forming a second pattern in the resist, wherein the same kind of laser oscillators are used as the first laser oscillator and the second laser oscillator, wherein a wavelength of the third laser beam is shorter than wavelengths of the first laser beam and the second laser beam, and wherein a harmonic is used as the third laser beam.

10. The exposure method according to claim 9, wherein fundamental waves are used as the first laser beam and the second laser beam.

11. The exposure method according to claim 9, wherein harmonics are used as the first laser beam and the second laser beam.

12. The exposure method according to claim 9, wherein second harmonics are used as the first laser beam and the second laser beam, and a third harmonic is used as the third laser beam.

13. The exposure method according to claim 9, wherein a solid-state laser oscillator is used as each of the first laser oscillator and the second laser oscillator.

14. The exposure method according to claim 9, wherein a YAG laser oscillator, a YVO$_4$ laser oscillator, a YLF laser oscillator, a YAlO$_3$ oscillator, or a GdVO$_4$ laser oscillator is used as each of the first laser oscillator and the second laser oscillator.

15. The exposure method according to claim 9, wherein the first laser beam passes through a fourier transform lens provided between the hologram recording medium and the mask at the step of recording the hologram.

16. A method of manufacturing a semiconductor device, comprising the steps of:
    forming a semiconductor film over a substrate;
    forming a conductive film over the semiconductor film;
    forming a resist over the conductive film;
    splitting a laser beam emitted from a first laser oscillator into a first laser beam and a second laser beam;
    illuminating a hologram recording medium with the first laser beam through a mask having a first pattern while illuminating the hologram recording medium with the second laser beam, thereby recording a hologram with the first pattern in the hologram recording medium;
    illuminating the hologram recording medium, in which the hologram is recorded with a third laser beam which is emitted from a second laser oscillator; and
    delivering the third laser beam, which has passed through the hologram recording medium onto the resist by using an optics configured to reduce a size of the first pattern, thereby forming a second pattern in the resist,
    wherein a wavelength of the third laser beam is shorter than wavelengths of the first laser beam and the second laser beam, and
    wherein the wavelength of the third laser beam is 1/(0.5×n) (where n is an integer not less than 3) of that of the first laser beam and the second laser beam.

17. The method of manufacturing a semiconductor device according to claim 16, wherein a solid-state laser oscillator is used as each of the first laser oscillator and the second laser oscillator.

18. The method of manufacturing a semiconductor device according to claim 16, wherein a YAG laser oscillator, a YVO$_4$ laser oscillator, a YLF laser oscillator, a YAlO$_3$ oscillator, or a GdVO$_4$ laser oscillator is used as each of the first laser oscillator and the second laser oscillator.

19. The method of manufacturing a semiconductor device according to claim 16, wherein the first laser beam passes through a fourier transform lens provided between the hologram recording medium and the mask at the step of recording the hologram.

20. A method of manufacturing a semiconductor device, comprising the steps of:
    forming a semiconductor film over a substrate;
    forming a conductive film over the semiconductor film;
    forming a resist over the conductive film;
    splitting a laser beam emitted from a first laser oscillator into a first laser beam and a second laser beam;
    illuminating a hologram recording medium with the first laser beam through a mask having a first pattern while illuminating the hologram recording medium with the second laser beam, thereby recording a hologram with the first pattern in the hologram recording medium;
    illuminating the hologram recording medium, in which the hologram is recorded with a third laser beam which is emitted from a second laser oscillator; and
    delivering the third laser beam, which has passed through the hologram recording medium onto the resist by using an optics configured to reduce a size of the first pattern, thereby forming a second pattern in the resist,
    wherein the same kind of laser oscillators are used as the first laser oscillator and the second laser oscillator,
    wherein a wavelength of the third laser beam is shorter than wavelengths of the first laser beam and the second laser beam, and
    wherein a harmonic is used as the third laser beam for illuminating the resist.

21. The method of manufacturing a semiconductor device according to claim 20, wherein a solid-state laser oscillator is used as each of the first laser oscillator and the second laser oscillator.

22. The method of manufacturing a semiconductor device according to claim 20, wherein a YAG laser oscillator, a YVO$_4$ laser oscillator, a YLF laser oscillator, a YAlO$_3$ oscillator, or a GdVO$_4$ laser oscillator is used as each of the first laser oscillator and the second laser oscillator.

23. The method of manufacturing a semiconductor device according to claim 20, wherein the first laser beam passes through a fourier transform lens provided between the hologram recording medium and the mask at the step of recording the hologram.

24. An exposure method comprising the steps of:
    illuminating a hologram recording medium, in which a hologram with a first pattern has been recorded by illumination with a laser beam emitted from a first laser oscillator, with a laser beam emitted from a second laser oscillator; and
    delivering the laser beam emitted from the second laser oscillator, which has passed through the hologram recording medium, onto a resist by using an optics configured to reduce a size of the first pattern, thereby forming a second pattern in the resist,
    wherein a wavelength of the laser beam used for illuminating the resist through the hologram recording medium in which the hologram is recorded is shorter than a wavelength of the laser beam used for recording the hologram in the hologram recording medium; and wherein the wavelength of the laser beam used for illuminating the resist is 1/(0.5×n) (where n is an integer not less than 3) of that of the laser beam used for recording the hologram.

25. The exposure method according to claim 24, wherein a solid-state laser oscillator is used as each of the first laser oscillator and the second laser oscillator.

26. The exposure method according to claim 24, wherein a YAG laser oscillator, a $YVO_4$ laser oscillator, a YLF laser oscillator, a $YAlO_3$ oscillator, or a $GdVO_4$ laser oscillator is used as each of the first laser oscillator and the second laser oscillator.

27. The exposure method according to claim 24, wherein the laser beam emitted from the first laser oscillator passes through a fourier transform lens provided between the hologram recording medium and a mask at the step of recording the hologram.

28. An exposure method comprising the steps of:
illuminating a hologram recording medium, in which a hologram with a first pattern has been recorded by illumination with a laser beam emitted from a first laser oscillator, with a laser beam emitted from a second laser oscillator; and
delivering the laser beam emitted from the second laser oscillator, which has passed through the hologram recording medium, onto a resist by using an optics configured to reduce a size of the first pattern, thereby forming a second pattern in the resist,
wherein the same kind of laser oscillators are used as the first laser oscillator and the second laser oscillator;
wherein a wavelength of the laser beam used for illuminating the resist through the hologram recording medium in which the hologram is recorded is shorter than a wavelength of the laser beam used for recording the hologram in the hologram recording medium; and
wherein a harmonic is used as the laser beam for illuminating the resist.

29. The exposure method according to claim 28, wherein a solid-state laser oscillator is used as each of the first laser oscillator and the second laser oscillator.

30. The exposure method according to claim 28, wherein a YAG laser oscillator, a $YVO_4$ laser oscillator, a YLF laser oscillator, a $YAlO_3$ oscillator, or a $GdVO_4$ laser oscillator is used as each of the first laser oscillator and the second laser oscillator.

31. The exposure method according to claim 28, wherein the laser beam emitted from the first laser oscillator passes through a fourier transform lens provided between the hologram recording medium and a mask at the step of recording the hologram.

* * * * *